(12) United States Patent
Suzuki et al.

(10) Patent No.: US 7,374,646 B2
(45) Date of Patent: May 20, 2008

(54) ELECTROLYTIC PROCESSING APPARATUS AND SUBSTRATE PROCESSING METHOD

(75) Inventors: Hidenao Suzuki, Tokyo (JP); Kazufumi Nomura, Tokyo (JP); Kunihito Ide, Tokyo (JP); Hiroyuki Kanda, Tokyo (JP); Koji Mishima, Tokyo (JP); Naoki Mihara, Tokyo (JP); Natsuki Makino, Tokyo (JP); Seiji Katsuoka, Tokyo (JP)

(73) Assignee: Ebara Corporation, Tokyo (JP)

( * ) Notice: Subject to any disclaimer, the term of this patent is extended or adjusted under 35 U.S.C. 154(b) by 528 days.

(21) Appl. No.: 10/767,253

(22) Filed: Jan. 30, 2004

(65) Prior Publication Data

US 2004/0256238 A1    Dec. 23, 2004

(30) Foreign Application Priority Data

Jan. 31, 2003  (JP)  ............................ 2003-025159
Nov. 13, 2003  (JP)  ............................ 2003-384322

(51) Int. Cl.
*C25D 17/00*  (2006.01)
*C25D 17/02*  (2006.01)
*C25D 17/06*  (2006.01)
*C25D 7/12*   (2006.01)

(52) U.S. Cl. ................................ 204/275.1
(58) Field of Classification Search ...................... None
See application file for complete search history.

(56) References Cited

U.S. PATENT DOCUMENTS 5,597,460 A * 1/1997 Reynolds .................... 204/212
6,368,475 B1 * 4/2002 Hanson et al. ............ 204/275.1
6,632,335 B2   10/2003 Kunisawa et al.
6,949,172 B1 *  9/2005 Hosten et al. ............. 204/275.1
2001/0052465 A1 * 12/2001 Dordi et al. .................. 205/95
2002/0020627 A1 *  2/2002 Kunisawa et al. ............ 205/96

FOREIGN PATENT DOCUMENTS

WO   WO 01/12882 A1 *  2/2001

* cited by examiner

*Primary Examiner*—Harry D Wilkins, III
(74) *Attorney, Agent, or Firm*—Wenderoth, Lind & Ponack, L.L.P.

(57) ABSTRACT

The present invention provides an electrolytic processing apparatus which is capable of increasing an in-plane uniformity of a film thickness of a plated film by making more uniform an electric field distribution over an entire surface to be processed of a substrate even if the substrate has a large area, and controlling more uniformly a speed, over the entire surface to be processed of the substrate. The electrolytic processing apparatus of this invention includes: a substrate holder for holding a substrate, a first electrode for being brought into contact with the substrate to supply current to a surface, to be processed, of the substrate; a second electrode disposed substantially parallel to the surface, to be processed, of the substrate in a position facing the surface, to be processed, of the substrate held by the substrate holder; a high resistance structure disposed between the substrate held by the substrate holder and the second electrode; an electrolytic solution introducing portion for introducing an electrolytic solution into a region across which the substrate held by the substrate holder and the high resistance structure face each other, from laterally of the high resistance structure; and a power source for applying a voltage between the first electrode and the second electrode.

2 Claims, 32 Drawing Sheets

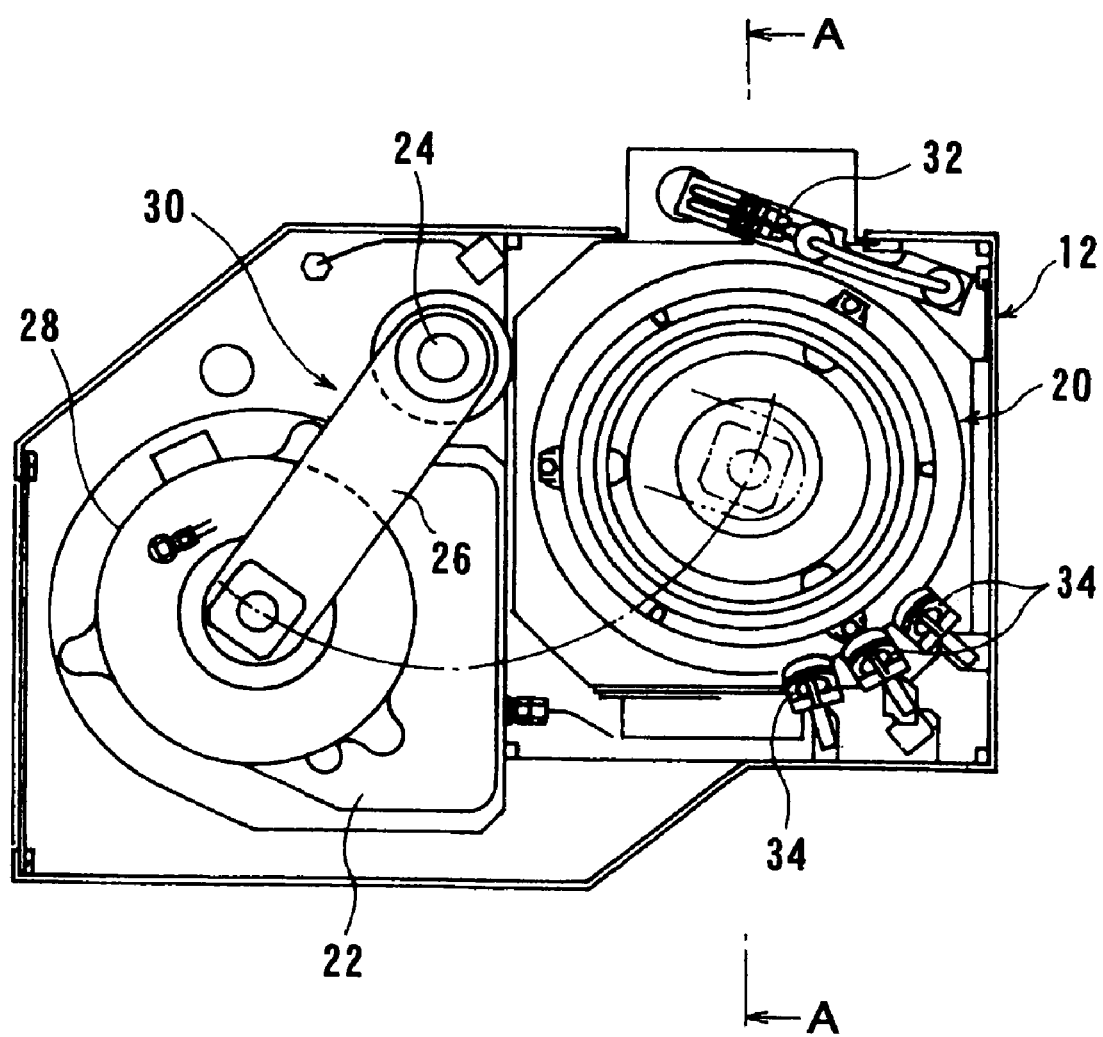
F I G. 2

F I G. 3
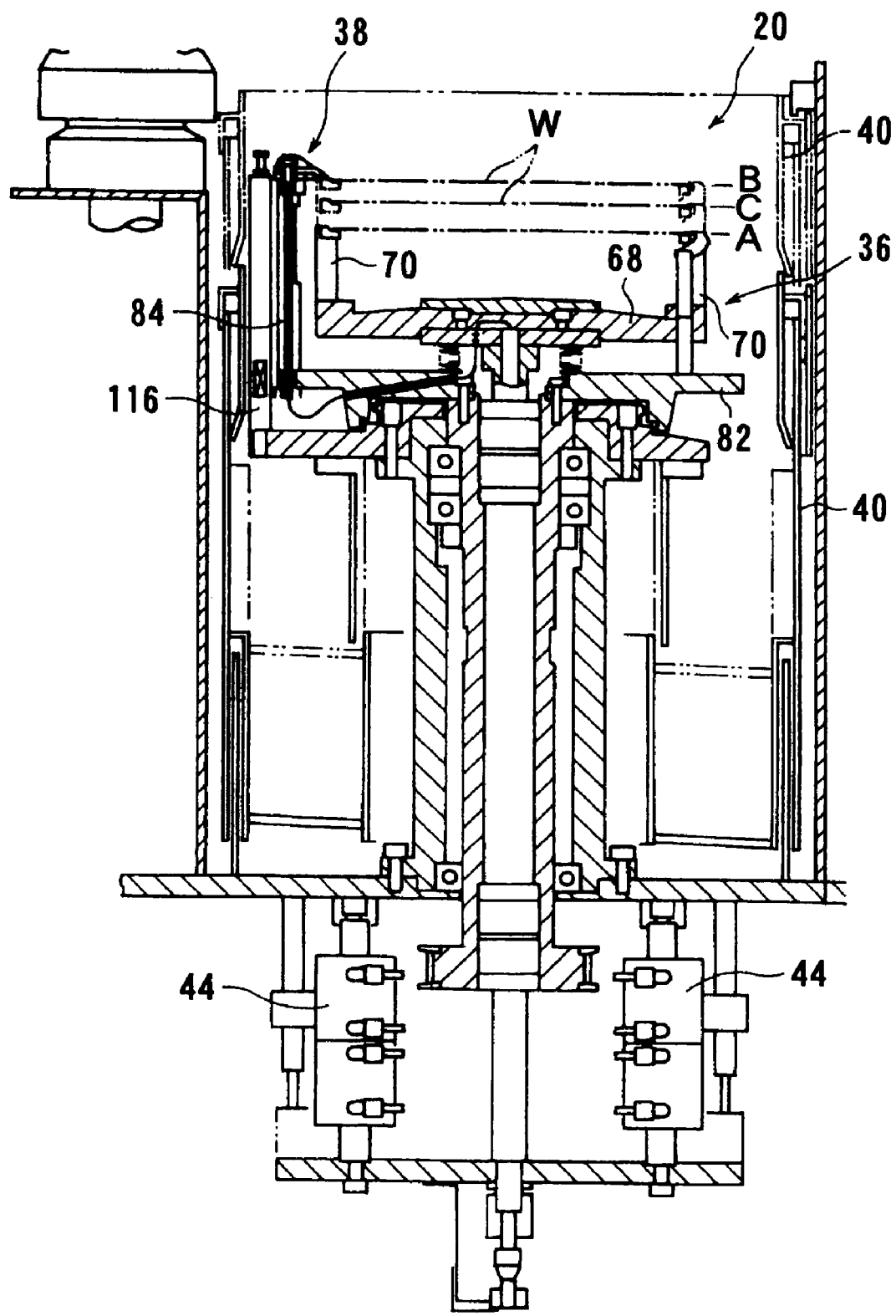

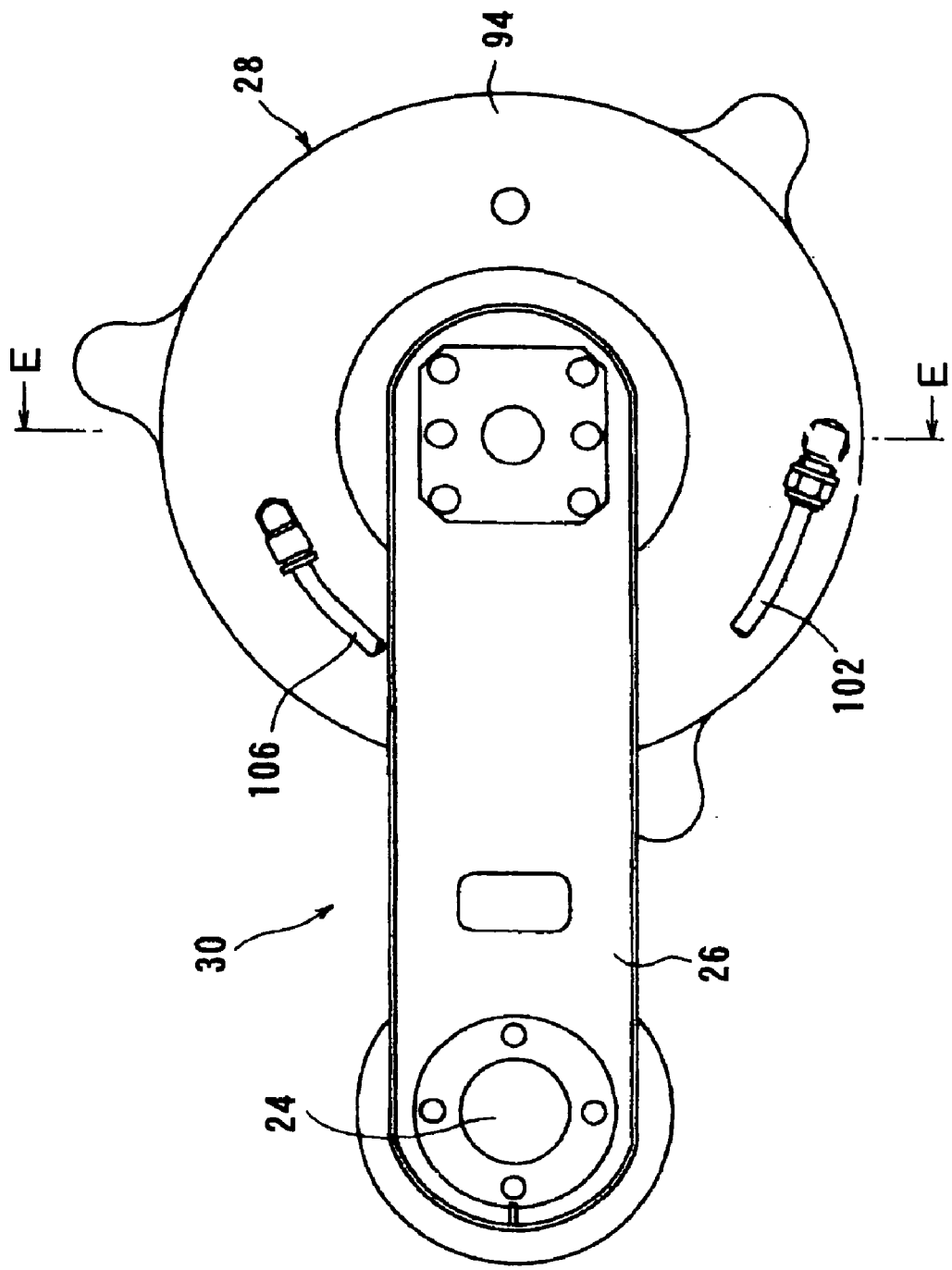

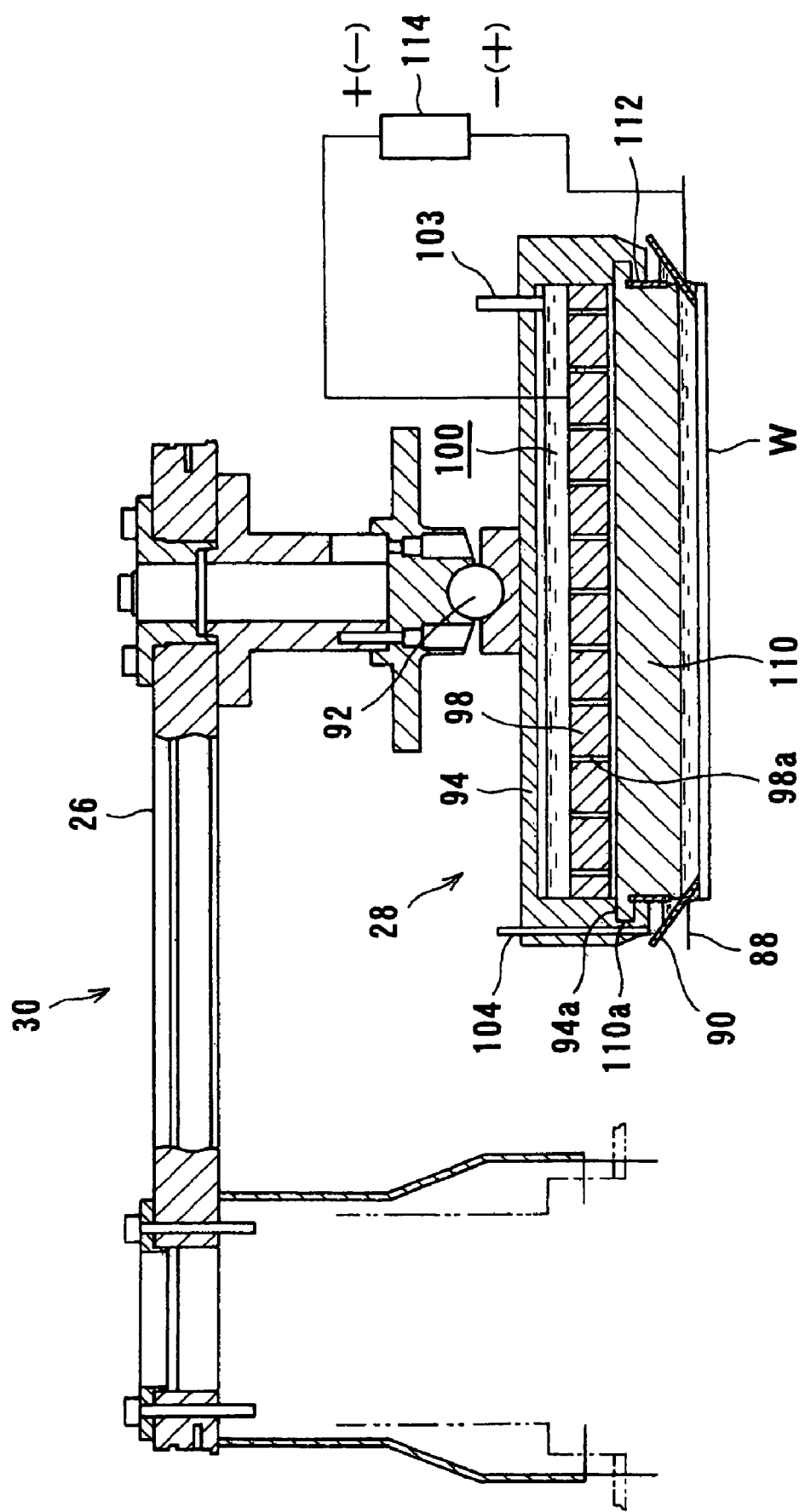

F I G. 1 2
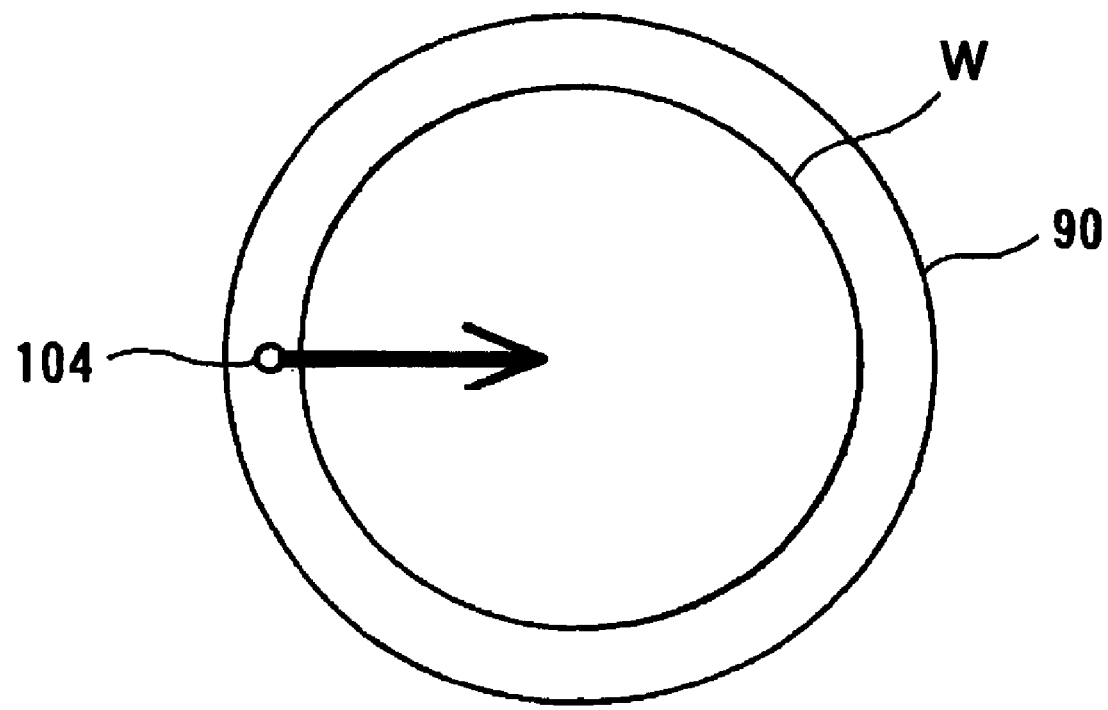

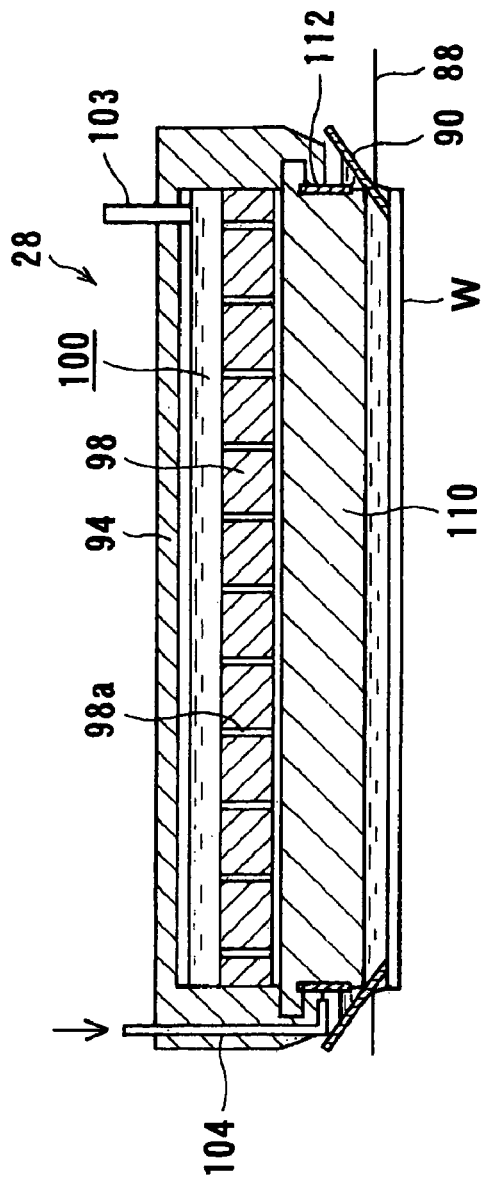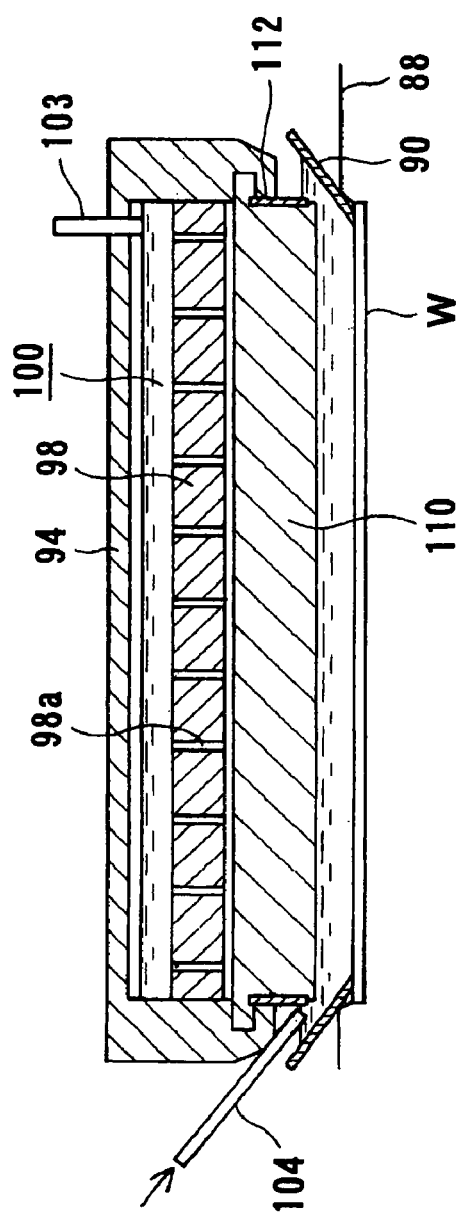
FIG. 13A
FIG. 13B

F I G. 22A
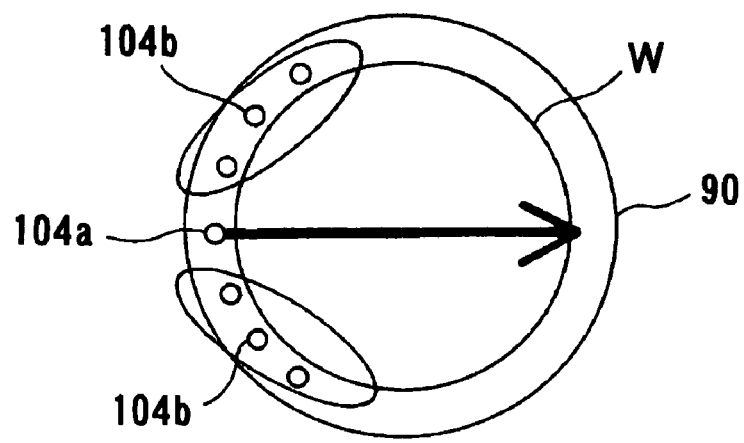
F I G. 22B
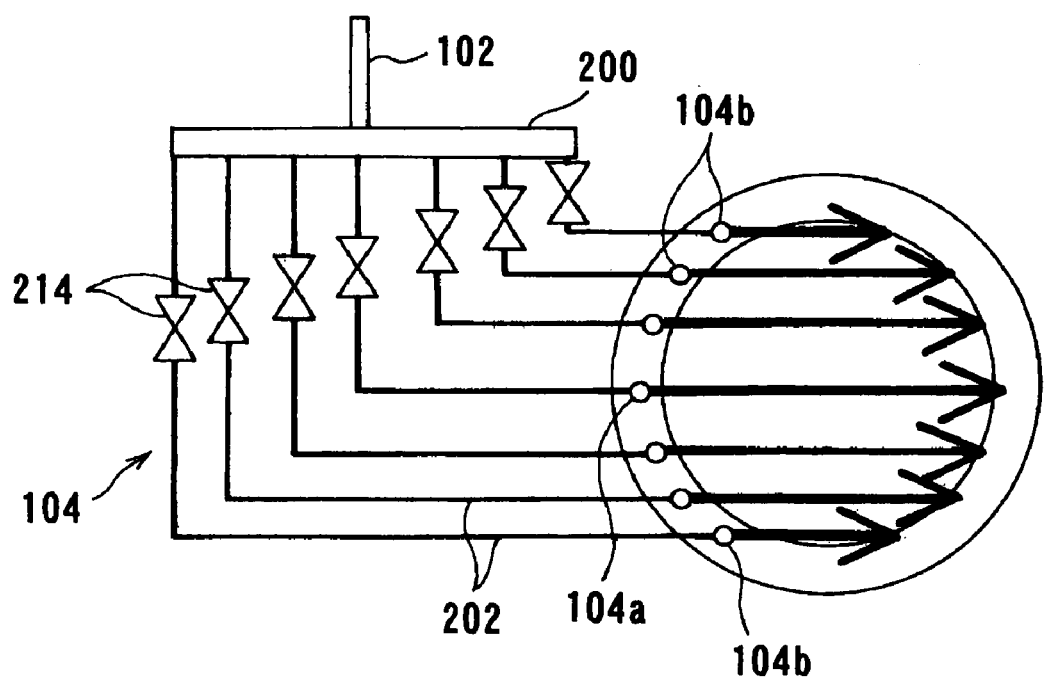

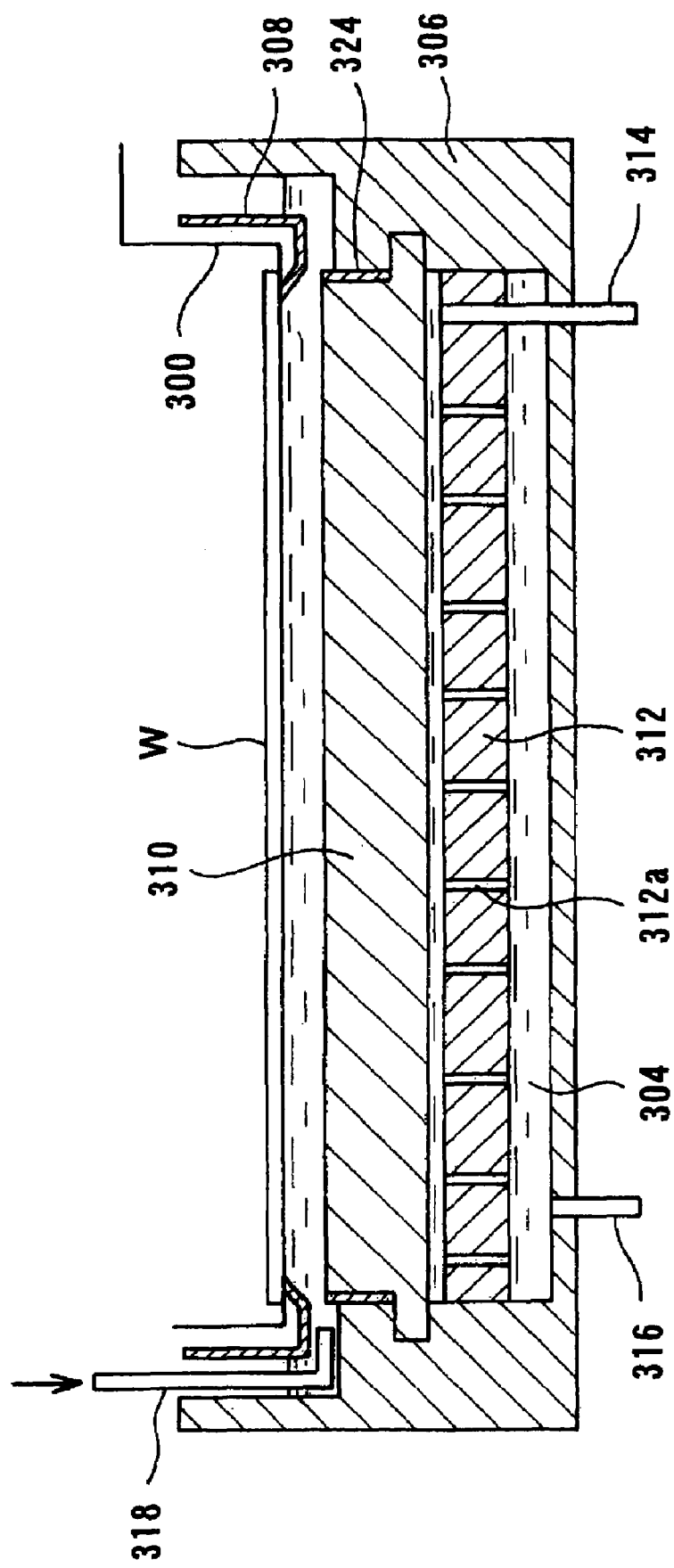

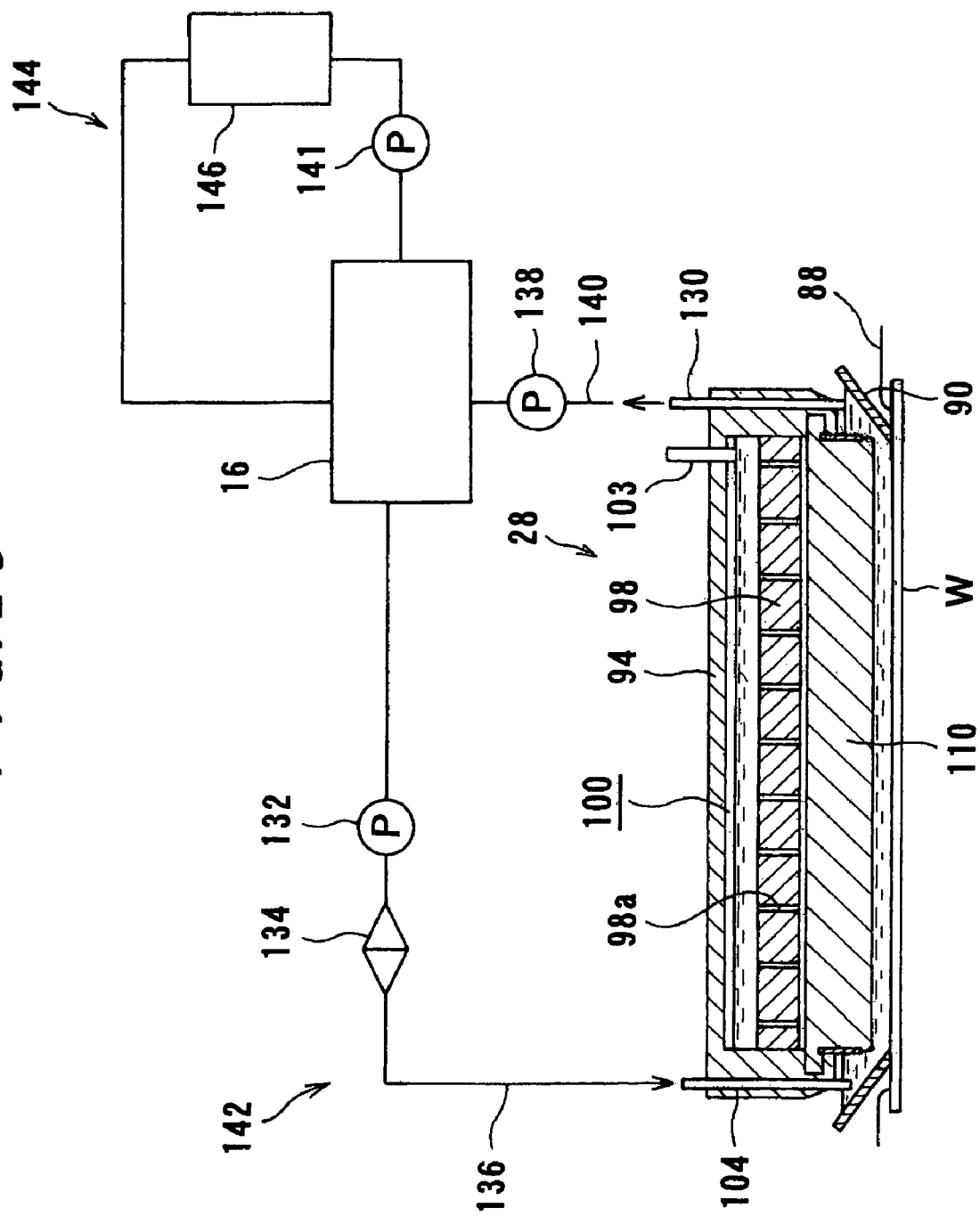

ELECTROLYTIC PROCESSING APPARATUS AND SUBSTRATE PROCESSING METHOD

BACKGROUND OF THE INVENTION

1. Field of the Invention

The present invention relates to an electrolytic processing apparatus and a substrate processing apparatus, and more particularly to an electrolytic processing apparatus which is used as an electroplating apparatus for use in forming interconnects by embedding a metal (interconnect material) such as copper or the like in interconnect recesses (interconnect pattern) that are formed in a semiconductor substrate, and a substrate processing apparatus which is generally used for wet-type processes such as a wet etching apparatus and a wet cleaning apparatus.

The substrate processing apparatus according to the present invention may be used as a so-called immersion-type exposure apparatus wherein a substrate is exposed to a laser beam which is converged underwater for an increased resolution.

The present invention also relates to a plating method and a plating apparatus, and more particularly to a plating method and a plating apparatus for use in forming interconnects by embedding a metal (interconnect material) such as copper or the like in interconnect recesses (interconnect pattern) that are formed in a surface of a substrate such as a semiconductor wafer, a printed-wiring board, a CSP (Chip Size Package) substrate, or the like.

2. Description of the Related Art

In recent years, instead of using aluminum or aluminum alloys as a material for forming interconnect circuits on a substrate, such as a semiconductor wafer or a printed-wiring board, there is an eminent movement towards using copper (Cu) that has a low electric resistivity and high electromigration resistance. Copper interconnects are generally formed by filling copper into fine recesses formed in a surface of a substrate. There are known various techniques for forming such copper interconnects, including CVD, sputtering, and plating. According to any such technique, a copper film is formed on substantially an entire surface of a substrate, followed by removal of unnecessary copper by performing chemical mechanical polishing (CMP).

FIGS. 38A through 38C illustrate, in sequence of process steps, an example of forming such a substrate W having copper interconnects. First, as shown in FIG. 38A, an insulating film 2 of $SiO_2$ is deposited on a conductive layer 1a in which electronic devices are formed, which is formed on a semiconductor base 1. Via holes 3 and trenches 4 for interconnect recesses are formed in the insulating film 2 by performing a lithography/etching technique. Thereafter, a barrier layer 5 of TaN or the like is formed on the insulating film 2, and a seed layer 7 as an electric supply layer for electroplating is formed on the barrier layer 5.

Then, as shown in FIG. 38B, copper plating is performed on a surface of the substrate W to fill the contact holes 3 and the trenches 4 of the semiconductor base 1 with copper and, at the same time, deposit a copper film 6 on the insulating film 2. Thereafter, the copper film 6 and the barrier layer 5 on the insulating film 2 are removed by performing chemical mechanical polishing (CMP) so as to make a surface of the copper filled in the contact holes 3 and the trenches 4 and the surface of the insulating film 2 lie substantially in the same plane. Interconnects composed of the copper film 6 as shown in FIG. 38C are thus formed.

Generally, for fabrication of semiconductor devices, there are performed various wet-type processes including the electroplating process described above, a wet-type etching process for removing, with an etching solution, an unnecessary metal film deposited or adhered to a surface of a substrate, for example, a wet-type cleaning process for removing, with pure water or a chemical solution, particles or the like adhered to a surface of a substrate, and the like.

There has also been developed a so-called immersion-type exposure apparatus wherein a light beam is focused in water whose refractive index is 1.44 times higher than air, thereby making a numerical aperture greater than if exposed in air, for an increased resolution.

Semiconductor wafers for LSI and liquid crystal substrates are showing a tendency to have their area growing year after year. When a plated film is formed on a surface of such a substrate by electroplating, such a tendency poses a problem in that the plated film is likely to have film thickness irregularities. Specifically, in order to give a cathode potential to the substrate, contacts for connection to electrodes are provided in a peripheral area of an electrically conductive layer, such as a seed layer or the like, that is formed in advance on the substrate. With the substrate having a large area, the electrically conductive layer ranging from contact in a periphery of the substrate to a center of the substrate has a large electric resistance, which develops a potential difference in the substrate. The potential difference brings about a plating rate difference, leading to film thickness irregularities of the plated film.

For electroplating a surface of a substrate, an electrically conductive layer such as a seed layer or the like is formed on the surface of the substrate, and the electrically conductive layer in the vicinity of an outer peripheral edge of the substrate is brought into contact with contacts for giving a cathode potential to the electrically conductive layer. An anode is positioned in a position facing the substrate, and a space between the anode and the substrate, which serves as a cathode, is filled with a plating solution. A plating current is then passed between the anode and the substrate (cathode) to plate the electrically conductive layer onto the substrate. If the substrate has a large area, then the electrically conductive layer ranging from contact in the vicinity of an outer peripheral edge of the substrate to a center of the substrate has a large electric resistance, which develops a potential difference in the substrate, and hence a plating rate difference between various parts of the substrate.

To prevent the above problem from arising, there has been proposed a plating apparatus having a plating solution impregnated material, which is made of a water retentive material for holding a plating solution, placed between a substrate and an anode, so that plating solution held by the plating solution impregnated material increases resistance due to the plating solution between the substrate and the anode, for thereby making more uniform an electric field distribution over an entire surface to be processed of the substrate. In the plating apparatus of this type, an electric field is likely to be disturbed locally owing to presence of a plating solution introducing tube extending in the plating solution impregnated material. It is generally difficult to correct a local electric field disturbance and to supply a fresh plating solution whose composition has been adjusted to the surface of the substrate.

An electroplating apparatus of a so-called face-down type holds a substrate with its surface (surface to be processed) facing downwardly, and is designed to plate the surface (lower surface) of the substrate. Generally, the electroplating apparatus forms a jet flow (upward flow) of plating solution toward a central region of the substrate. The plating solution of the jet flow impinges upon the central region of the substrate and thereafter flows along the surface of the substrate diametrically outwardly of the substrate, thereby plating the surface of the substrate. Consequently, a speed of the plating solution flowing along the surface of the substrate differs between the central region of the substrate and a peripheral region of the substrate. If the substrate is of a large area, particularly, then this speed difference becomes so large that a plating performance differs, thereby causing film thickness irregularities of a plated film. The jet flow poses a problem in that it tends to entrain bubbles that are present in a plating bath.

With respect to a wet-type process, e.g., an immersion process such as an immersion etching process for immersing a substrate in an etching solution to etch a surface of the substrate, it is generally difficult to perform a so-called face-up etching process wherein the substrate is held with its surface (surface to be processed) facing upwardly, and the etching solution is supplied to and held on the surface (upper surface) to etch the substrate. Since the substrate is generally held and delivered for various processes while its surface is facing upwardly, it is necessary to invert the substrate by 180° each time an immersion process such as an immersion etching process is to be performed on the substrate.

The immersion-type exposure apparatus described previously is desired to perform an exposure process such that air bubbles tending to deteriorate an optical system will not be produced underwater. It is generally difficult to make an arrangement for satisfying such a demand.

With respect to the above-described copper interconnects, e.g., copper interconnects at a packaging level, interconnect recesses such as trenches and via holes having an opening width or diameter of several tens μm and an aspect ratio of at least 1 are formed in a surface of a substrate, and copper is embedded in the recesses (trenches and via holes). For increasing production efficiency for formation of interconnects, it is required to embed copper reliably at a high rate in interconnect recesses having an opening width or diameter of several tens μm and an aspect ratio of at least 1 according to copper plating.

In conventional general plating apparatus, a surface of a substrate, which has interconnect recesses covered with an electrically conductive layer, and an anode are disposed in facing relation to each other. After a space between the substrate and the anode is filled with a plating solution, a voltage is applied between the substrate and the anode to deposit a plated film on a surface of the electrically conductive layer. The plating solution which fills the space between the substrate and the anode is placed in a static state where it produces completely no flow or almost no flow during this plating process.

However, when a copper plating process is performed with a conventional general plating apparatus to embed copper at a high rate (e.g., a rate twice a conventional rate) in interconnect recesses defined in a surface of a substrate and having an opening width or diameter of several tens μm and an aspect ratio of at least 1, an electric field concentrates on opening ends (inlets) of the interconnect recesses to precipitate copper preferentially there, thereby closing the inlets of the interconnect recesses before copper is fully embedded in the interconnect recesses. Therefore, voids tend to be produced in copper (plated film) embedded in the interconnect recesses.

For embedding copper reliably in the interconnect recesses without forming voids therein, there is a certain limitation on a plating rate, and copper can currently be embedded only at a plating rate of at most about several hundreds nm/min. Therefore, there has been a strong demand for development of a plating technique capable of embedding copper at a higher rate without producing voids therein. It is considered that the demand will be stronger as the aspect ratio of interconnect recesses will be larger in the future.

SUMMARY OF THE INVENTION

The present invention has been made in view of the above situation in the related art. It is therefore a first object of the present invention to provide an electrolytic processing apparatus which is capable of increasing an in-plane uniformity of a film thickness of a plated film by making more uniform an electric field distribution over an entire surface to be processed of a substrate even if the substrate has a large area, and controlling more uniformly speed, over the entire surface to be processed of the substrate, of a plating solution which flows along the surface to be processed of the substrate, and a substrate processing apparatus which is capable of supplying and holding a liquid (processing liquid) such as pure water, a chemical solution, or the like uniformly, without bubbles mixed therein, on a surface of a substrate which is held with the surface facing upwardly.

It is a second object of the present invention to provide a plating method and a plating apparatus which are capable of embedding a metal such as copper or the like, at a higher speed without producing voids therein, in interconnect recesses defined in a surface of a substrate and having an opening width or diameter of several tens μm and an aspect ratio of at least 1, for example.

The present invention provides an electrolytic processing apparatus comprising: a substrate holder for holding a substrate; a first electrode for being brought into contact with the substrate to supply current to a surface, to be processed, of the substrate; a second electrode disposed substantially parallel to the surface, to be processed, of the substrate in a position facing the surface, to be processed, of the substrate when held by the substrate holder; a high resistance structure disposed between the substrate when held by the substrate holder and the second electrode; an electrolytic solution introducing portion for introducing an electrolytic solution into a region across which the substrate held by the substrate holder and the high resistance structure face each other, from laterally of the high resistance structure; and a power source for applying a voltage between the first electrode and the second electrode.

Since the electrolytic solution is introduced into the region across which the substrate held by the substrate holder and the high resistance structure face each other from laterally of the high resistance structure, a need for any parts responsible for disturbing an electric field distribution, such as an electrolytic solution supply tube made of an insulating material, within the high resistance structure is eliminated. Even if the substrate has a large area, the electric field distribution over an entire surface of the substrate is made more uniform, and when the electrolytic solution is introduced, the electrolytic solution retained within the high resistance structure is prevented from leaking from the high resistance structure. Therefore, fresh plating solution whose composition has been adjusted is supplied into the region across which the substrate held by the substrate holder and the high resistance structure face each other.

In a preferred embodiment of the present invention, the apparatus further comprises an electrode holder which holds the second electrode and the high resistance structure, wherein the electrolytic solution introducing portion is provided through the electrode holder.

In a preferred embodiment of the present invention, the apparatus further comprises an electrode holder which holds the second electrode and the high resistance structure, wherein the electrolytic solution introducing portion is disposed laterally of the electrode holder.

Preferably, the apparatus further comprise an air ejecting portion for ejecting air to the region across which the substrate held by the substrate holder and the high resistance structure face each other.

With the above arrangement, when electrolytic solution is introduced from the electrolytic solution introducing portion, air is applied to both sides of this introduced solution (electrolytic solution) to prevent the electrolytic solution from flowing around, thereby preventing bubbles from being produced due to mixing of electrolytic solution flows.

Preferably, the apparatus further comprises an air drawing portion for drawing air from the region across which the substrate held by the substrate holder the high resistance structure face each other.

With the above arrangement, when electrolytic solution is introduced from the electrolytic solution introducing portion, air is drawn from the region across which the substrate held by the substrate holder and the high resistance structure face each other, thereby assisting in spreading the electrolytic solution.

In a preferred embodiment of the present invention, the high resistance structure is vertically movable and tiltable, and the high resistance structure is tilted, and while electrolytic solution is being introduced into the region across which the substrate held by the substrate holder and the high resistance structure face each other from a side where the substrate held by the substrate holder and the high resistance structure are closest to each other, the high resistance structure is lowered back to a horizontal state.

With the above arrangement, as the high resistance structure is lowered back to the horizontal state, air that is present in the region across which the substrate held by the substrate holder and the high resistance structure face each other is gradually forced out in one direction by the electrolytic solution, and the electrolytic solution is supplied to the region, thereby allowing air bubbles to be removed well.

In a preferred embodiment of the present invention, the high resistance structure is horizontally held and vertically movable, and while electrolytic solution is being introduced into the region across which the substrate horizontally held by the substrate holder and the high resistance structure face each other, the high resistance structure is lowered.

The present invention provides another electrolytic processing apparatus comprising: a substrate holder for holding a substrate; a first electrode for being brought into contact with the substrate to supply current to a surface, to be processed, of the substrate; a second electrode disposed substantially parallel to the surface, to be processed, of the substrate in a position facing the surface, to be processed, of the substrate when held by the substrate holder; an electrolytic solution introducing portion for introducing an electrolytic solution into a region between the substrate when held by the substrate holder and the second electrode, from laterally of the substrate; and a power source for applying a voltage between the first electrode and the second electrode.

By thus introducing electrolytic solution into the region between the substrate held by the substrate holder and the second electrode (e.g., an anode), from laterally of the substrate, fresh electrolytic solution whose composition has been adjusted can be supplied along the surface of the substrate.

Preferably, the apparatus further comprises a deaerating device for removing a dissolved gas from electrolytic solution which is introduced from the electrolytic solution introducing portion.

This arrangement is effective in preventing a dissolved gas in the electrolytic solution from being mixed as air bubbles in the electrolytic solution when the electrolytic solution is introduced, and hence from remaining in the electrolytic solution.

The electrolytic solution introducing portion preferably has a distal end shaped as a nozzle or a slit.

In an electrolytic processing apparatus wherein the electrolytic solution is introduced over a substrate during electrolytic processing, when the electrolytic solution is introduced, a reaction may occur which tends to prevent a plated film, for example, from being embedded or partially change properties of a plated film. To prevent such a reaction, it is desirable to pour the electrolytic solution at a linear speed in a range from 0.1 to 10 m/sec. to complete introduction of the electrolytic solution over a wafer having a diameter of 300 mm, for example, within 5 seconds. The electrolytic solution introducing portion should preferably be shaped to meet such a demand.

A check valve is preferably disposed in the electrolytic solution introducing portion, or a porous member is filled in the electrolytic solution introducing portion.

When a plurality of branch pipes branched from a single common pipe are used and electrolytic solution is introduced via the common pipe and the branch pipes, for example, if air is entrapped in one of the branch pipes, pressure in the pipes may be brought out of balance, thereby possibly causing the electrolytic solution in the pipes to fall at one time. The check valve or the porous member is used to keep the electrolytic solution in the branch pipes at all times, thereby preventing the above drawback and supplying electrolytic solution at a constant rate at all times.

The electrolytic solution introducing portion is preferably disposed in positions along a circumferential direction of a peripheral edge of the substrate when held by the substrate holder.

With the above arrangement, a position and number of electrolytic solution introducing portions may be adjusted as desired to easily control a flow speed of the electrolytic solution flowing along the surface (to be processed) of the substrate over an entire surface of the substrate. Time spent to introduce the electrolytic solution over the substrate can be reduced, and air bubbles can be removed well.

The electrolytic solution introducing portion may be disposed in positions facing each other across the substrate when held by the substrate holder.

Time spent to introduce the electrolytic solution over the substrate can further be reduced. In this case, air is forced and discharged out in a direction perpendicular to a flow of electrolytic solution.

In a preferred embodiment of the present invention, the substrate holder is rotatable, and electrolytic solution is introduced from the electrolytic solution introducing portion while the substrate holder is rotated together with the substrate.

With this arrangement, air that is forced out by introduction of plating solution can be moved toward an outer circumference of the substrate under centrifugal forces produced by rotation of the substrate, and hence can be removed well.

The electrolytic solution introducing portion may have a plurality of liquid delivery pumps for delivering the electrolytic solution at spaced time intervals.

The electrolytic solution is preferably introduced from the electrolytic solution introducing portion at a linear speed ranging from 0.1 to 10 m/sec., and introduction of the electrolytic solution over the substrate is completed within 5 seconds.

The present invention provides yet another electrolytic processing apparatus comprising: a substrate holder for holding a substrate; a first electrode for being brought into contact with the substrate to supply current to a surface, to be processed, of the substrate; a second electrode disposed substantially parallel to the surface, to be processed, of the substrate in a position facing the surface, to be processed, of the substrate when held by the substrate holder; a high resistance structure disposed between the substrate when held by the substrate holder and the second electrode; an electrolytic solution circulating system having an electrolytic solution introducing portion for introducing an electrolytic solution into a region across which the substrate held by the substrate holder and the resistance structure face each other, from laterally of the high resistance structure, and an electrolytic solution drawing portion for drawing for circulation the electrolytic solution introduced into the region, from laterally of the high resistance structure; and a power source for applying a voltage between the first electrode and the second electrode.

With this arrangement, a need for any parts responsible for disturbing an electric field distribution, such as an electrolytic solution supply tube made of an insulating material, within the high resistance structure is eliminated. When the electrolytic solution is introduced, electrolytic solution retained within the high resistance structure is prevented from leaking from the high resistance structure. Furthermore, the electrolytic solution is introduced from laterally of the high resistance structure into and circulated in the region between the substrate held by the substrate holder and the high resistance structure, so that the electrolytic solution can flow between the substrate and the high resistance structure at all times. Therefore, when an electroplating process, for example, is performed, a plating defect such as a plated film deposition failure due to a plating solution flow stoppage is prevented from occurring. By rotating the substrate if necessary, the electrolytic solution can flow at a constant speed in central and peripheral regions of the substrate.

In a preferred embodiment of the present invention, the apparatus further comprises an electrode holder which holds the second electrode and the high resistance structure, wherein at least one of the electrolytic solution introducing portion and the electrolytic solution drawing portion is disposed through the electrode holder.

In a preferred embodiment of the present invention, the apparatus further comprises an electrode holder which holds the second electrode and the high resistance structure, wherein at least one of the electrolytic solution introducing portion and the electrolytic solution drawing portion is disposed laterally of the electrode holder.

The present invention provides yet another electrolytic processing apparatus comprising: a substrate holder for holding a substrate; a first electrode for being brought into contact with the substrate to supply current to a surface, to be processed, of the substrate; a second electrode disposed substantially parallel to the surface, to be processed, of the substrate in a position facing the surface, to be processed, of the substrate when held by the substrate holder; an electrolytic solution circulating system having an electrolytic solution introducing portion for introducing an electrolytic solution into a region between the substrate when held by the substrate holder and the second electrode, from laterally of the substrate, and an electrolytic solution drawing portion for drawing for circulation the electrolytic solution introduced into the region, from laterally of the substrate; and a power source for applying a voltage between the first electrode and the second electrode.

By thus introducing for circulation the electrolytic solution into the region between the substrate held by the substrate holder and the second electrode (e.g., an anode), from laterally of the substrate to allow the electrolytic solution to flow at all times between the substrate and the second electrode (e.g., an anode), when an electroplating process, for example, is performed, a plating defect such as a plated film deposition failure due to a plating solution flow stoppage is prevented from occurring. By rotating the substrate if necessary, the electrolytic solution can flow at a constant speed in central and peripheral regions of the substrate.

Preferably, the electrolytic solution circulating system has a deaerating device for removing a dissolved gas from electrolytic solution in circulation.

Preferably, the electrolytic solution introducing portion and/or the electrolytic solution drawing portion has a distal end shaped as a nozzle or a slit.

Preferably, a check valve is disposed in the electrolytic solution introducing portion or a porous member is filled in the electrolytic solution introducing portion.

At least one of the electrolytic solution introducing portion and the electrolytic solution drawing portion is, for example, disposed in positions along a circumferential direction of a peripheral edge of the substrate when held by the substrate holder.

The electrolytic solution introducing portion and the electrolytic solution drawing portion are, for example, disposed in positions facing each other across the substrate when held by the substrate holder.

With this arrangement, the electrolytic solution is introduced into the region between the substrate when held by the substrate holder and the second electrode (e.g., an anode), from laterally of the substrate, and flows in one direction in the region for circulation.

The present invention provides a substrate processing apparatus comprising: a substrate holder for holding a substrate; a member disposed substantially parallel to a surface, to be processed, of the substrate in a position facing the surface, to be processed, of the substrate when held by the substrate holder; a liquid introducing portion for introducing a liquid into a region across which the substrate, when held by the substrate holder, and the member face each other, from laterally of the member; and an air ejecting portion for ejecting air to the region across which the substrate, when held by the substrate holder, and the member face each other, and/or an air drawing portion for drawing air from the region.

By thus introducing the liquid into the region across which the substrate, when held by the substrate holder, and the member face each other, from laterally of the member, even if the substrate is held with its surface facing upwardly, a liquid such as pure water, a chemical solution, or the like is uniformly supplied and retained between the substrate and the member without mixing of bubbles therein, and a substrate processing process such as a wet-type process such as an etching process, a cleaning process, or the like, for example, or an immersion-type exposure process or the like can be performed. When the liquid is introduced from the liquid introducing portion, air may be applied to both sides of this introduced liquid (liquid), whereby the liquid is prevented from flowing around, thus preventing bubbles from being formed due to mixing of liquid flows. Air may be drawn from the region across which the substrate, when held by the substrate holder, and the member face each other to assist in spreading the liquid.

The present invention provides another substrate processing apparatus comprising: a substrate holder for holding a substrate; a member disposed substantially parallel to a surface, to be processed, of the substrate in a position facing the surface, to be processed, of the substrate when held by the substrate holder; and a liquid introducing portion for introducing a liquid into a region across which the substrate, when held by the substrate holder, and the member face each other, from laterally of the member; wherein the member is vertically movable and tiltable, and wherein the member is tilted, and while the liquid is being introduced into the region across which the substrate, when held by the substrate holder, and the member face each other from a side where the substrate held by the substrate holder and the member are closest to each other, the member is lowered back to a horizontal state.

With the above arrangement, as the member is lowered back to the horizontal state, air that is present in the region across which the substrate held by the substrate holder and the member face each other is gradually forced out in one direction by the liquid, and the liquid is supplied to the region, thereby allowing air bubbles to be removed well.

The present invention provides yet another substrate processing apparatus comprising: a substrate holder for holding a substrate; a member disposed substantially parallel to a surface, to be processed, of the substrate in a position facing the surface, to be processed, of the substrate when held by the substrate holder; and a liquid introducing portion for introducing a liquid into a region across which the substrate held by the substrate holder and the member face each other, from laterally of the member; wherein the member is vertically movable, and wherein while the liquid is being introduced into the region across which the substrate held by the substrate holder and the member face each other, the member is lowered.

The present invention provides yet another substrate processing apparatus comprising: a substrate holder for holding a substrate; a member disposed substantially parallel to a surface, to be processed, of the substrate in a position facing the surface, to be processed, of the substrate when held by the substrate holder; and a liquid introducing portion having a check valve disposed therein or a porous member filled therein, for introducing a liquid into a region across which the substrate held by the substrate holder and the member face each other, from laterally of the member.

When a plurality of branch pipes branched from a single common pipe are used and the liquid is introduced via the common pipe and the branch pipes, for example, if air is entrapped in one of the branch pipes, pressure in the pipes may be brought out of balance, thereby possibly causing the liquid in the pipes to fall at one time. The check valve or the porous member is used to keep the liquid in the branch pipes at all times, thereby preventing the above drawback and supplying the liquid at a constant rate at all times.

In a preferred embodiment of the present invention, the apparatus further comprises a member holder for holding the member, wherein the liquid introducing portion is provided through the member holder or disposed laterally of the member holder.

The present invention provides yet another substrate processing apparatus comprising: a substrate holder for holding a substrate; a member disposed substantially parallel to a surface, to be processed, of the substrate in a position facing the surface, to be processed, of the substrate when held by the substrate holder; and a liquid circulating system having a liquid introducing portion for introducing a liquid into a region across which the substrate held by the substrate holder and the member face each other, from laterally of the member, and a liquid drawing portion for drawing for circulation the liquid from laterally of the member.

By thus introducing for circulation the liquid into the region between the substrate held by the substrate holder and the member, from laterally of the member to allow the liquid to flow at all times between the substrate and the member, fresh liquid whose composition has been adjusted is applied into the region between the substrate and the member at all times. By rotating the substrate if necessary, the liquid can flow at a constant speed in central and peripheral regions of the substrate.

The present invention provides a plating method comprising: placing an anode in facing relation to a surface of a substrate which has an interconnect recess covered with an electrically conductive layer; filling a region between the substrate and the anode with a plating solution having a uniform high-speed flow over the surface of the substrate; and applying a voltage between the substrate and the anode to deposit a plated film on a surface of the electrically conductive layer.

By thus filling a region between the substrate and the anode with a plating solution having a uniform high-speed flow over an entire surface of the substrate and embedding the interconnect recess by plating, an electric field concentration at an opening end (inlet) of the interconnect recess (a trench or a via hole) can be lessened by a high-speed flow of plating solution. By increasing a plating rate based on composition of the plating solution and plating conditions, copper or the like can be embedded in the interconnect recess in a void-free fashion at a higher rate.

Preferably, the high-speed flow of the plating solution has a speed in a range from 0.5 to 10 M/sec.

By thus setting the speed of the high-speed flow of plating solution to 0.5 to 10 m/sec., an electric field concentration at the opening end (inlet) of the interconnect recess can be lessened by the high-speed flow of plating solution. The speed of the high-speed flow of plating solution should preferably be in a range from 1 to 10 m/sec., and more preferably in the range from 8 to 10 M/sec.

The substrate and the anode are preferably kept out of contact with each other and spaced from each other by at most 10 mm.

By thus keeping the substrate and the anode out of contact with each other, but spacing them apart by a distance of at most 10 mm, it is easy to form a uniform high-speed flow of plating solution, which has a speed ranging from 0.5 to 10 m/sec., for example, over the entire surface of the substrate, between the substrate and the anode.

In a preferred embodiment of the present invention a high resistance structure is disposed between the substrate and the anode.

With this arrangement, plating solution is introduced in a complex pattern into the high resistance structure, and flows through a long path in a transverse direction of the high resistance structure, thereby causing the high resistance structure to impose a large resistance. Therefore, resistance imposed by the electrically conductive layer is made negligible, thus reducing an in-plane difference of current density due to electric resistance of a surface of the substrate to thereby increase an in-plane uniformity of a plated film.

The substrate and the high resistance structure are preferably kept out of contact with each other and spaced from each other by at most 10 mm.

Preferably, a voltage having a current value in a range from 10 to 50 mA/cm$^2$ is applied between the electrically conductive layer and the anode.

By thus applying a voltage of a high current value between the electrically conductive layer and the anode, a plating rate can be increased. The current value should preferably be in a range from 20 to 50 mA/cm$^2$ and more preferably from 40 to 50 mA/cm$^2$.

The interconnect recess comprises a trench and/or a via hole having an opening width or diameter of at least 10 µm and an aspect ratio of at least 1 for example.

The present invention provides a plating apparatus comprising: a substrate holder for holding a substrate having a surface having an interconnect recess covered with an electrically conductive layer; an electrode portion having a cathode for being brought into contact with the electrically conductive layer of the substrate when held by the substrate holder to supply current to the electrically conductive layer; an anode disposed in a position facing the surface of the substrate held by the substrate holder; a plating solution flow forming section for introducing a plating solution between the anode and the surface of the substrate held by the substrate holder and discharging the plating solution therefrom, to form a uniform high-speed flow of the plating solution over the surface of the substrate; and a power source for applying a voltage between the cathode and the anode.

The plating solution flow forming section preferably has a flow rate controller for controlling a flow rate of the plating solution introduced between the anode and the surface of the substrate held by the substrate holder.

BRIEF DESCRIPTION OF THE DRAWINGS

FIG. 2 is a plan view of the electroplating apparatus (electrolytic processing apparatus) shown in FIG. 1;

FIG. 3 is an enlarged cross-sectional view of a substrate holder and an electrode portion of the electroplating apparatus shown in FIG. 1;

FIG. 10 is a plan view of an electrode arm portion of the electroplating apparatus shown in FIG. 1;

FIG. 11 is a cross-sectional view schematically showing an electrode head and the substrate holder of the electroplating apparatus shown in FIG. 1 when in an electroplating process;

FIG. 12 is a view showing a positional relationship between a substrate, a sealing member, and an electrolytic solution introducing portion (liquid introducing portion) of the electroplating apparatus shown in FIG. 1 when in a plating process;

FIGS. 13A and 13B are views showing different modifications, respectively, of the electrode head;

FIGS. 22A and 22B are views showing further different examples, respectively, of the electrolytic solution introducing portion (liquid introducing portion);

FIG. 24 is a view showing essential parts of an electroplating apparatus (electrolytic processing apparatus) according to another embodiment of the present invention;

FIG. 25 is a view showing essential parts of an electroplating apparatus (electrolytic processing apparatus) according to still another embodiment of the present invention, together with a plating solution circulating system (liquid circulating system);

DETAILED DESCRIPTION OF THE PREFERRED EMBODIMENTS

Preferred embodiments of the present invention will now be described in detail with reference to the drawings.

Figure 1:
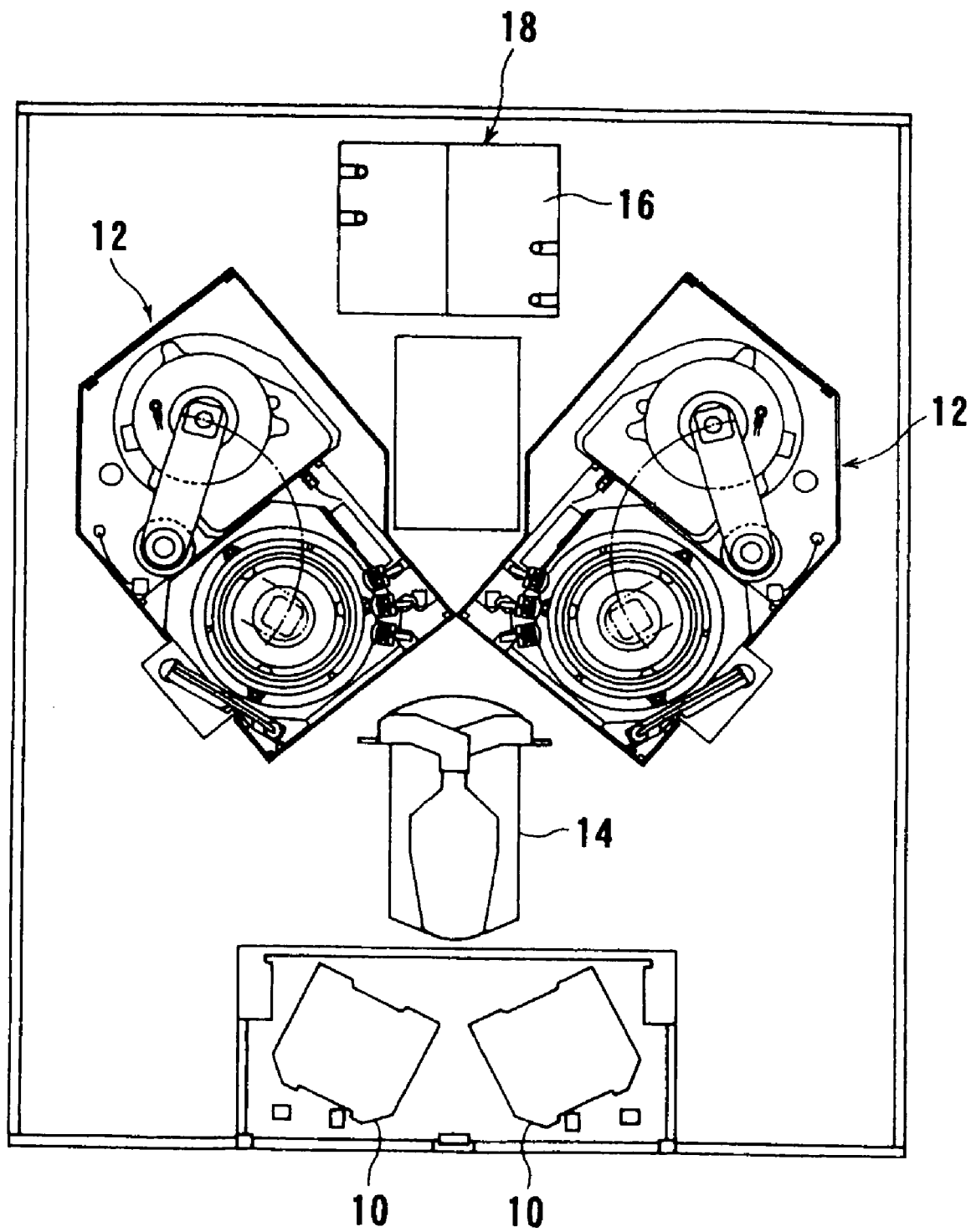
FIG. 1 is a plan view showing a substrate processing system incorporating an electrolytic processing apparatus, which is applied to an electroplating apparatus, according to an embodiment of the present invention.

FIG. 1 is a plan view showing a substrate processing system incorporating an electrolytic processing apparatus (substrate processing apparatus), which is applied to an electroplating apparatus, according to an embodiment of the present invention. As shown in FIG. 1, this substrate processing system has a facility which houses therein two loading/unloading units 10 for housing a plurality of substrates W therein, two electroplating apparatuses (electrolytic processing apparatuses and substrate processing apparatuses) 12 for performing electroplating and processing incidental thereto, a transfer robot 14 for transferring substrates W between the loading/unloading units 10 and the electroplating apparatuses 12, and plating solution supply equipment 18 having a plating solution tank 16.

If electroplating apparatus 12 is used as a substrate processing apparatus for performing a wet-type process, an immersion-type exposure process, or the like, then the plating solution tank 16 serves as a liquid tank for storing a liquid such as pure water, a chemical solution, or the like, and the plating solution supply equipment 18 serves as a liquid supply equipment for supplying a liquid.

The electroplating apparatus 12, as shown in FIG. 2, is provided with a substrate processing section 20 for performing plating and processing incidental thereto, and a plating solution tray 22 for storing a plating solution (electrolytic solution) is disposed adjacent the substrate processing section 20. There is also provided an electrode arm portion 30 having an electrode head 28 which is held at a front end of a swing arm 26 swingable about a rotating shaft 24 and which is swung between the substrate processing section 20 and the plating solution tray 22. Furthermore, a pre-coating/recovering arm 32, and fixed nozzles 34 for ejecting pure water or a chemical liquid such as ion water, and also a gas or the like toward a substrate, are disposed laterally of the substrate processing section 20. In this embodiment, three of the fixed nozzles 34 are disposed, and one of them is used for supplying pure water.

The substrate processing section 20, as shown in FIG. 3, has a substrate holder 36 for holding a substrate W with its surface (processing surface) facing upwardly, and an electrode portion 38 located above the substrate holder 36 so as to surround a peripheral portion of the substrate holder 36. Further, a substantially cylindrical bottomed splash prevention cup 40 surrounding a periphery of the substrate holder 36, for preventing scatter of various chemical liquids used during processing, is provided so as to be vertically movable by an air cylinder (not shown).

The substrate holder 36 is adapted to be raised and lowered by an air cylinder 44 to and from a lower substrate transfer position A, an upper plating position (substrate processing position) B, and a pretreatment/cleaning position C that is intermediate positions A and B. The substrate holder 36 is also adapted to rotate, at an arbitrary acceleration and an arbitrary velocity, integrally with the electrode portion 38 by a rotating motor and a belt (not shown). Substrate carry-in and carry-out openings (not shown) are provided in confrontation with substrate transfer position A in a side panel of the electroplating apparatus 12 facing the transfer robot 14. When the substrate holder 36 is raised to plating position B, a sealing member 90 and cathodes (first electrodes) 88 (to be described below) of the electrode portion 38 are brought into contact with a peripheral edge portion of substrate W held by the substrate holder 36. On the other hand, the splash prevention cup 40 has an upper end located below the substrate carry-in and carry-out openings, and when the splash prevention cup 40 ascends, the upper end of the cup 40 reaches a position above the electrode portion 38 closing the substrate carry-in and carry-out openings, as shown by imaginary lines in FIG. 3.

The plating solution tray 22 serves to wet a high resistance structure 110 and an anode (second electrode) 98 (to be described later on) of the electrode arm portion 30 with a plating solution, when plating has not been performed. The plating solution tray 22 is set at a size in which the high resistance structure 110 can be accommodated, and the plating solution tray 22 has a plating solution supply port and a plating solution drainage port (not shown). A photo-sensor is attached to the plating solution tray 22, and can detect brimming with the plating solution in the plating solution tray 22, i.e., overflow, and drainage.

The electrode arm portion 30 is vertically movable by a vertical movement motor, which is a servomotor, and a ball screw (not shown), and swingable between the plating solution tray 22 and the substrate processing section 20 by a swing motor.

Figure 4:
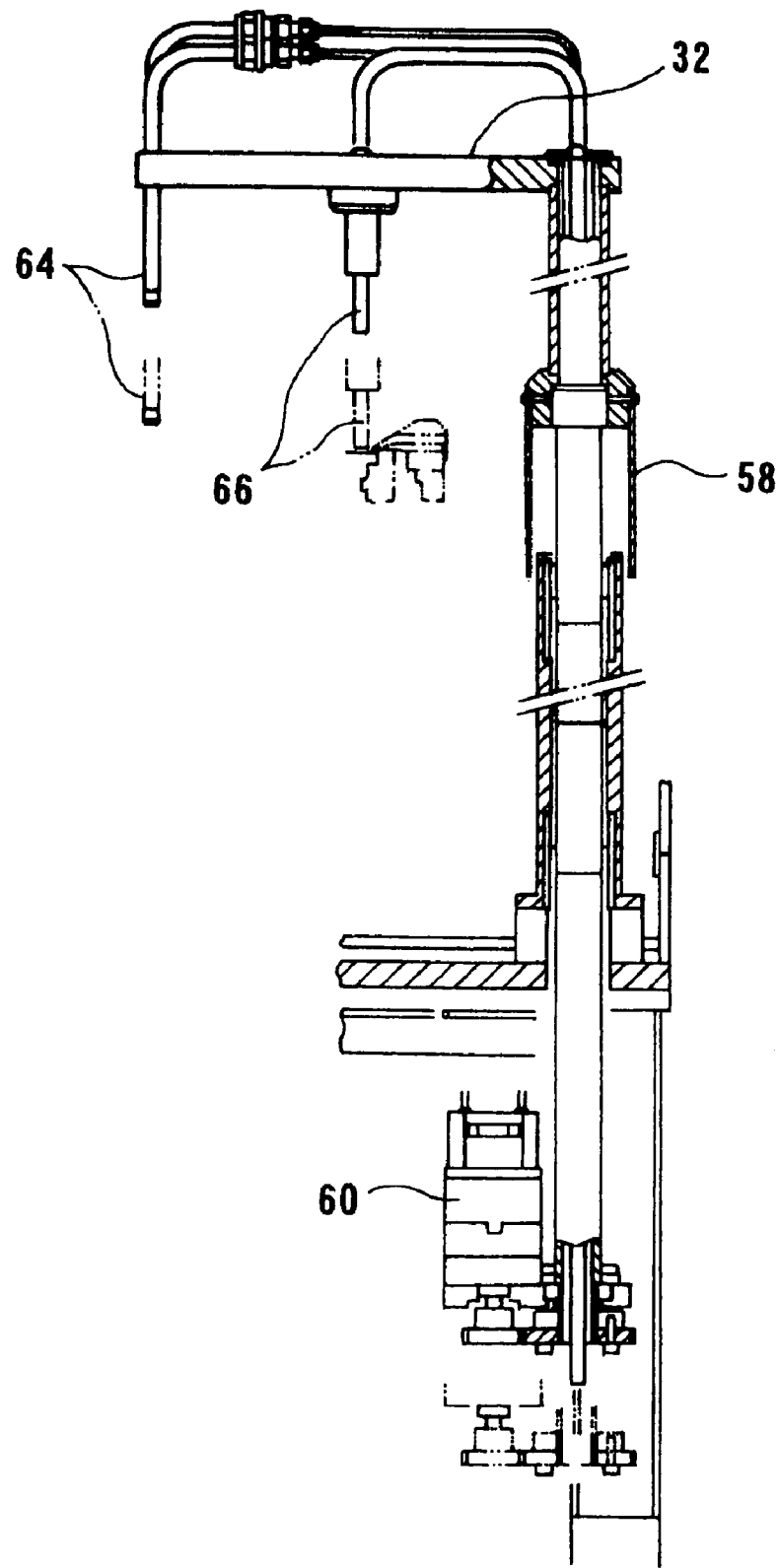
FIG. 4 is a front view of a pre-coating/recovering arm of the electroplating apparatus shown in FIG. 1.

As shown in FIG. 4, the pre-coating/recovering arm 32 is coupled to an upper end of a vertical support shaft 58. The pre-coating/recovering arm 32 is swingable by a rotary actuator 60 and is also vertically moveable by an air cylinder (not shown). The pre-coating/recovering arm 32 supports a pre-coating nozzle 64 for discharging a pre-coating liquid, on its free end, and a plating solution recovering nozzle 66 for recovering plating solution, on a portion closer to its proximal end. The pre-coating nozzle 64 is connected to a syringe that is actuatable by an air cylinder, for example, for intermittently discharging a pre-coating liquid from the pre-coating nozzle 64. The plating solution recovering nozzle 66 is connected to a cylinder pump or an aspirator, for example, to draw plating solution on the substrate from the plating solution recovering nozzle 66.

Figure 5:
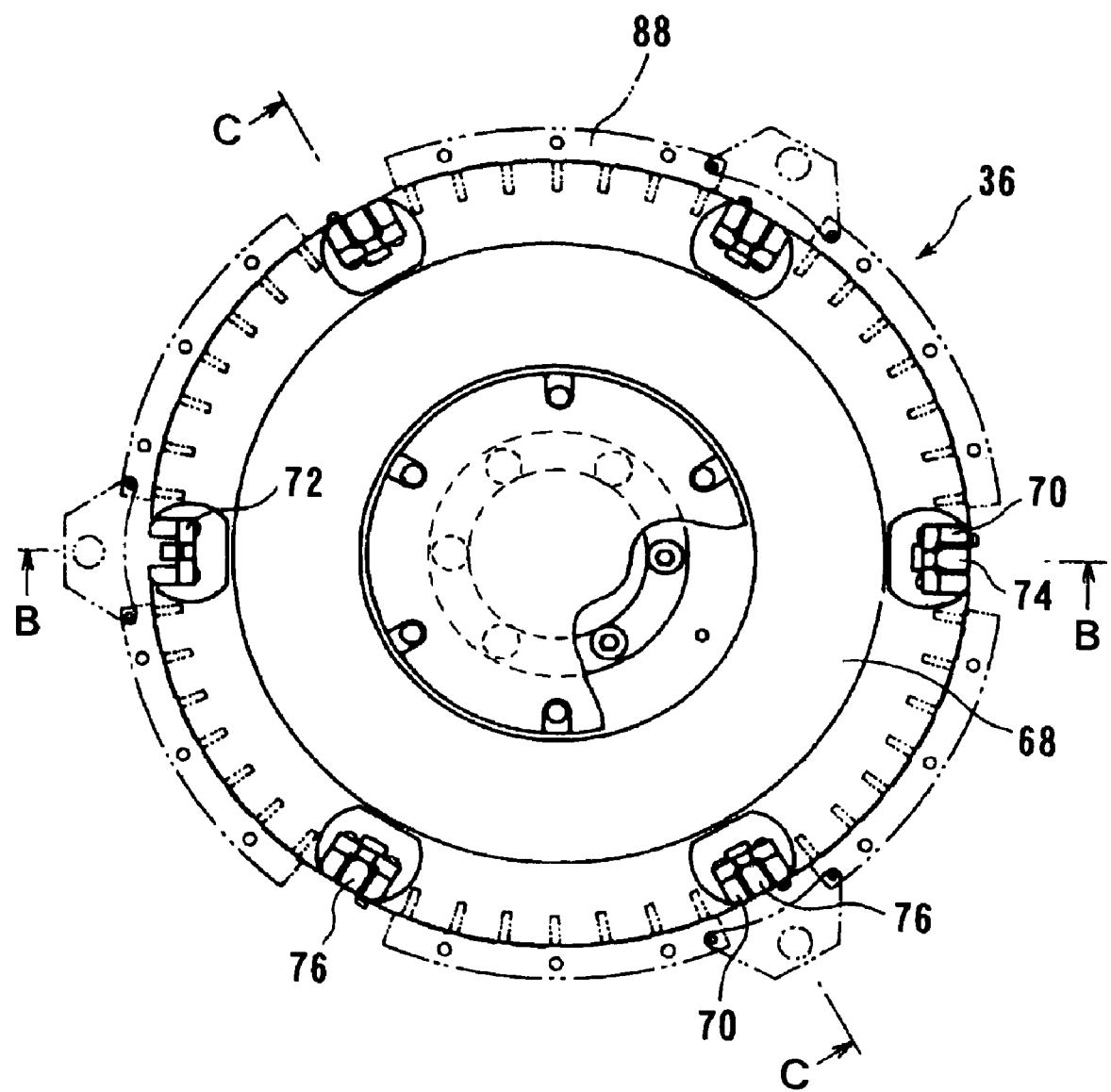
FIG. 5 is a plan view of the substrate holder of the electroplating apparatus shown in FIG. 1.
Figure 6:
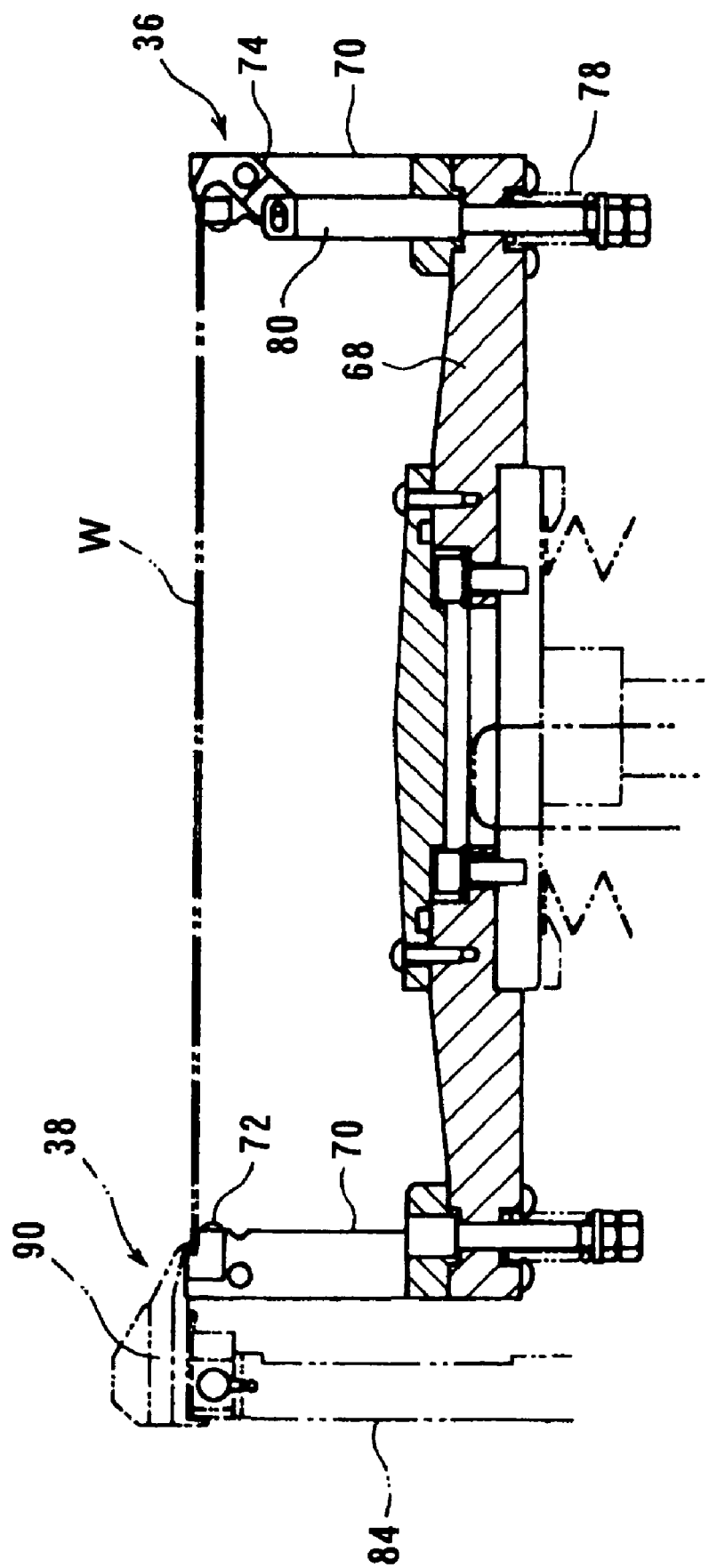
FIG. 6 is a sectional view taken along line B-B of FIG. 5.
Figure 7:
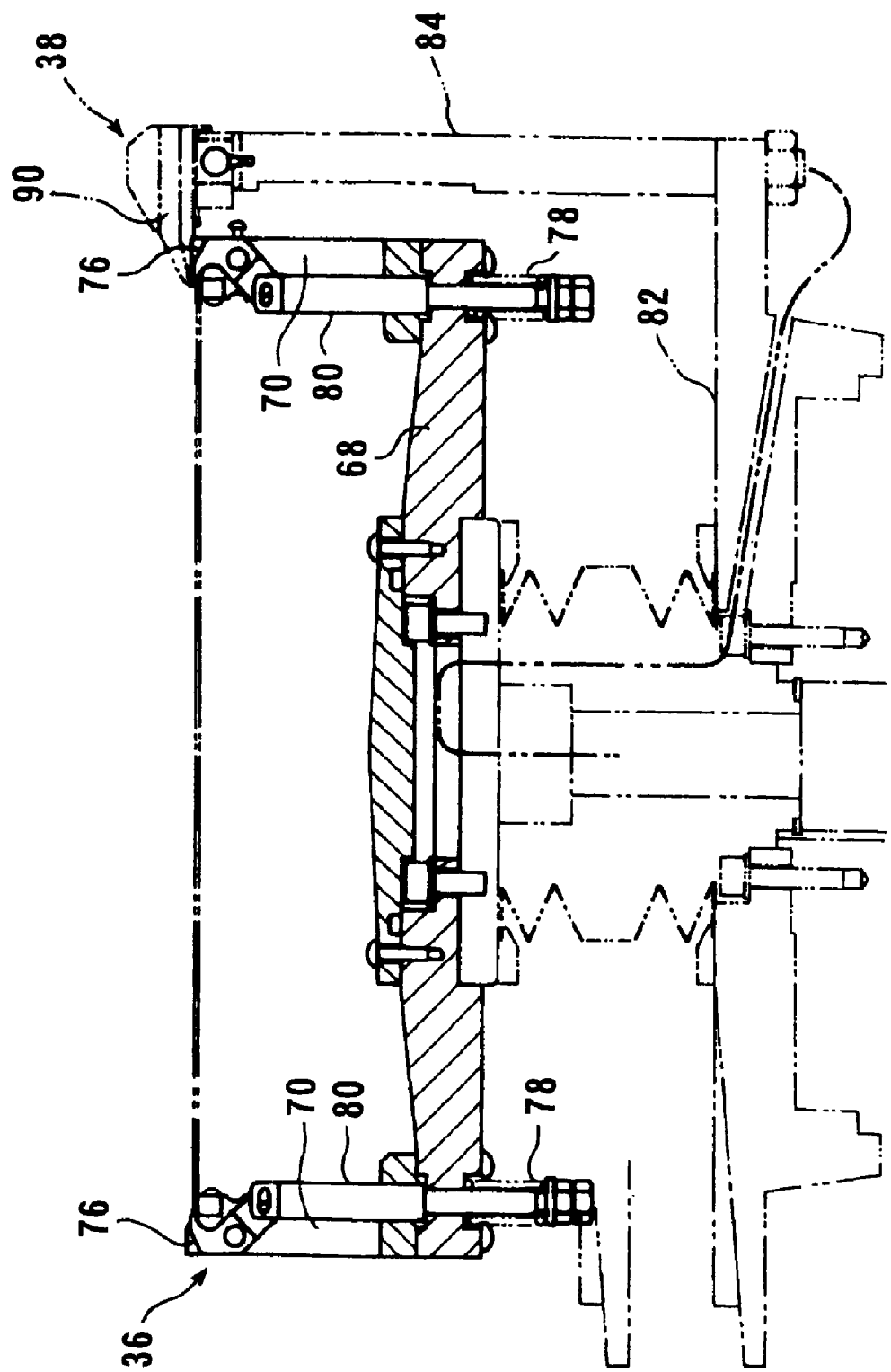
FIG. 7 is a sectional view taken along line C-C of FIG. 5.

As shown in FIGS. 5 through 7, the substrate holder 36 has a disk-shaped substrate stage 68 and six vertical support arms 70 disposed at spaced intervals on a circumferential edge of the substrate stage 68 for holding a substrate W in a horizontal plane on respective upper surfaces of the support arms 70. A positioning plate 72 is mounted on an upper end one of the support arms 70 for positioning the substrate by contacting an end face of the substrate W. A pressing finger 74 is rotatably mounted on an upper end of the support arm 70, which is positioned opposite to the support arm 70 having the positioning plate 72, for abutting the end face of the substrate W and pressing the substrate W to the positioning plate 72 when rotated. Chucking fingers 76 are rotatably mounted on upper ends of the remaining four support arms 70 for pressing the substrate W downwardly and gripping a circumferential edge of the substrate W.

The pressing finger 74 and the chucking fingers 76 have respective lower ends coupled to upper ends of pressing pins 80 that are normally urged to move downwardly by coil springs 78. When the pressing pins 80 are moved downwardly, the pressing finger 74 and the chucking fingers 76 are rotated radially inwardly into a closed position. A support plate 82 is disposed below the substrate stage 68 for engaging lower ends of the opening pins 80 and pushing them upwardly.

When the substrate holder 36 is located in substrate transfer position A shown in FIG. 3, the pressing pins 80 are engaged and pushed upwardly by the support plate 82, so that the pressing finger 74 and the chucking fingers 76 rotate outwardly and open. When the substrate stage 68 is elevated, the opening pins 80 are lowered under resiliency of the coil springs 78, so that the pressing finger 74 and the chucking fingers 76 rotate inwardly and close.

Figure 8:
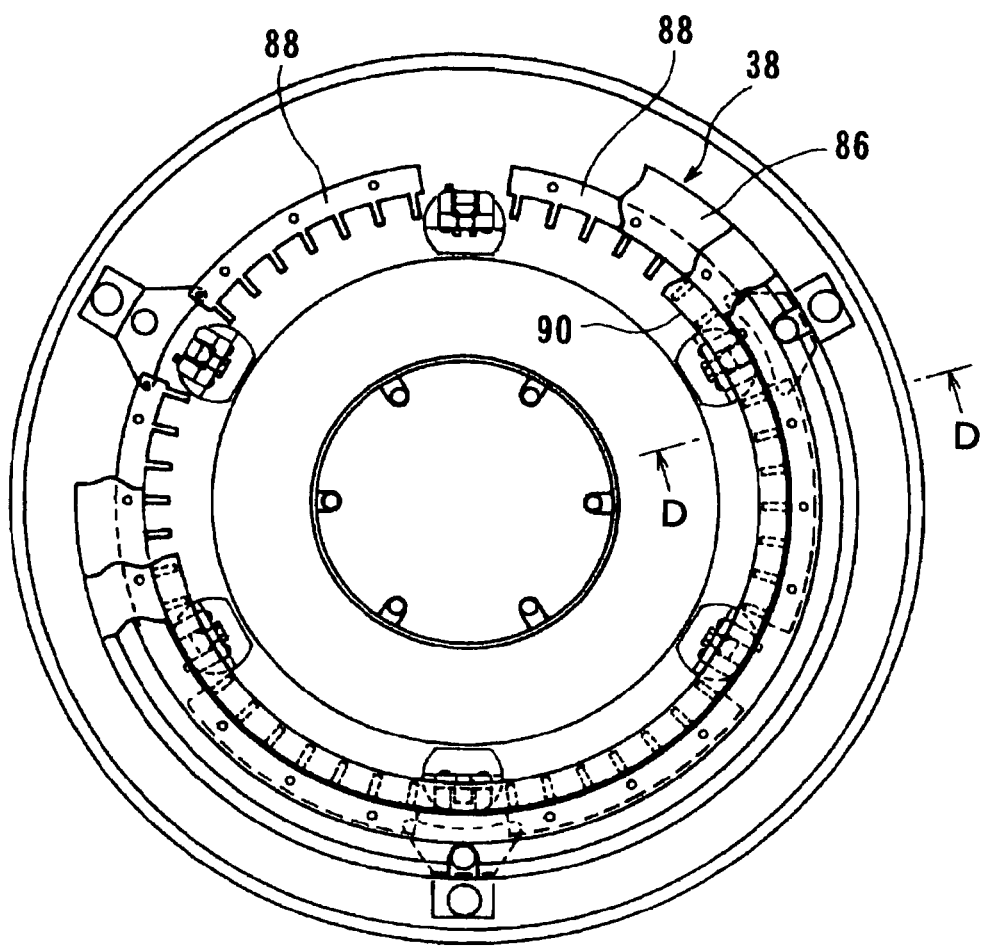
FIG. 8 is a plan view of the electrode portion of the electroplating apparatus shown in FIG. 1.
Figure 9:
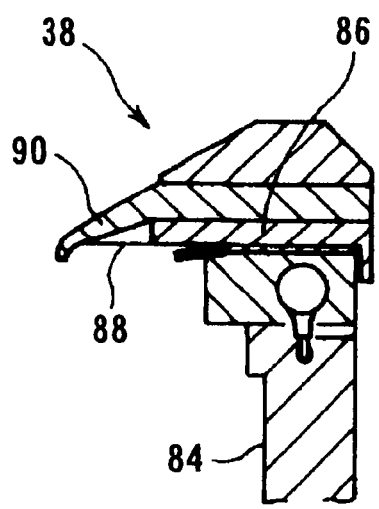
FIG. 9 is a sectional view taken along line D-D of FIG. 8.

As shown in FIGS. 8 and 9, the electrode portion 38 comprises an annular frame 86 fixed to upper ends of vertical support columns 84 mounted on a peripheral edge of the support plate 82 (see FIG. 7), a plurality of, six in this embodiment, cathodes (first electrodes) 88 attached to a lower surface of the frame 86 and projecting inwardly, and the annular sealing member 90 mounted on an upper surface of the frame 86 in covering relation to upper surfaces of the cathodes 88. The cathodes (first electrodes) 88 become an anode during electrolytic etching. The sealing member 90 is adapted to have an inner peripheral edge portion inclined inwardly downwardly and progressively thin-walled, and to have an inner peripheral end suspending downwardly.

When the substrate holder 36 has ascended to plating position B, as shown FIG. 3, the cathodes 88 are pressed against the peripheral edge portion of the substrate W held by the substrate holder 36 for thereby allowing electric current to pass through the substrate W. At the same time, an inner peripheral end portion of the sealing member 90 is brought into contact with an upper surface of the peripheral edge of the substrate W under pressure to seal its contact portion in a watertight manner. As a result, plating solution supplied onto an upper surface (processing surface) of the substrate W is prevented from seeping from an end portion of the substrate W, and the plating solution is prevented from contaminating the cathodes 88.

In this embodiment, the electrode portion 38 is vertically immovable, but rotatable in a body with the substrate holder 36. However, the electrode portion 38 may be arranged such that it is vertically movable and the sealing member 90 is pressed against a surface, to be processed, of the substrate W when the electrode portion 38 is lowered.

As shown in FIGS. 10 and 11, the electrode head 28 of the electrode arm section 30 includes an electrode holder (member holder) 94 which is coupled via a ball bearing 92 to a free end of the swing arm 26, and a high resistance structure (member) 110 which is disposed such that it closes a bottom opening of the electrode holder 94. The electrode holder 94 has a downward-open and cup-like bottomed configuration having at its lower inside a recess portion 94a, while the high resistance structure 110 has at its top a flange portion 110a. The flange portion 110a is inserted into the recess portion 94a. The high resistance structure 110 is thus held with the electrode holder 94, while a hollow plating solution chamber 100 is defined in the electrode holder 94.

If the electroplating apparatus 12 is used as a substrate processing apparatus for performing a wet-type process, an immersion-type exposure process, or the like, as described below, then the electrode holder 94 serves as a member holder for holding a desired member that suits this purpose.

The high resistance structure 110 is composed of porous ceramic such as alumina, SiC, mullite, zirconia, titania or cordierite, or a hard porous material such as a sintered compact of polypropylene or polyethylene, or a composite material comprising these materials. The high resistance structure 110 may be composed of a woven fabric or a non-woven fabric. In case of an alumina-based ceramic, for example, a ceramic with a pore diameter of 30 to 200 μm is used. In case of an SiC ceramic, SiC with a pore diameter of not more than 30 μm, a porosity of 20 to 95%, and a thickness of about 1 to 20 mm, preferably 5 to 20 mm, more preferably 8 to 15 mm, is used. The high resistance structure 110, in this embodiment, is constituted of a porous ceramic of alumina having a porosity of 30%, and an average pore diameter of 100 μm. This porous ceramic plate per se is an insulator, but the high resistance structure is constituted to have lower electric conductivity than that of plating solution by causing the plating solution to enter its interior complicatedly and follow a considerably long path in a thickness direction.

Figure 38A:
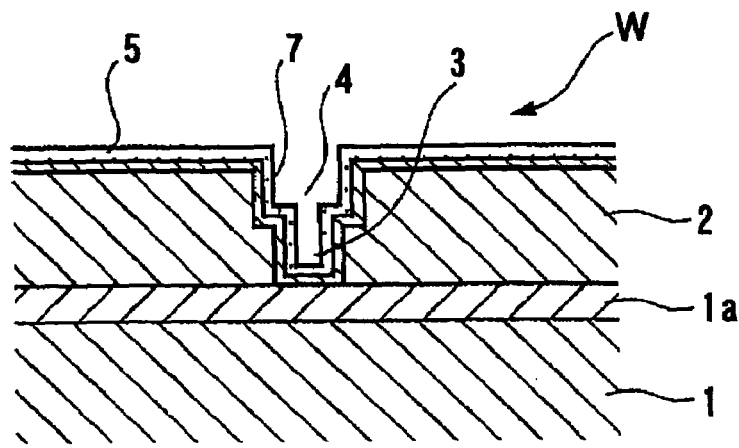
FIGS. 38A through 38C illustrate an example of forming copper interconnects by performing a plating process.
Figure 38B:
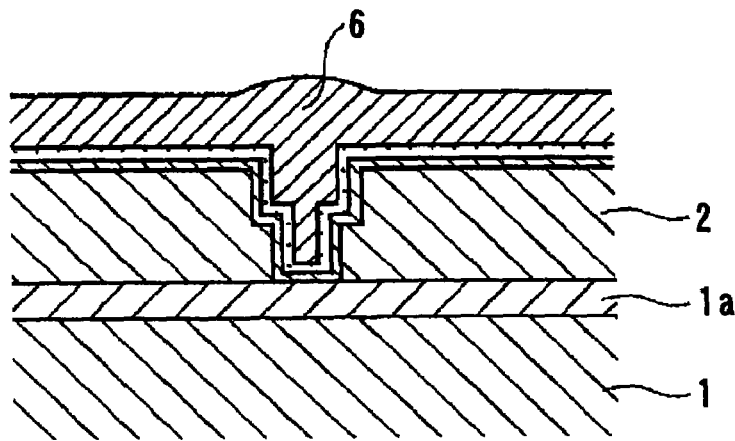
Figure 38C:
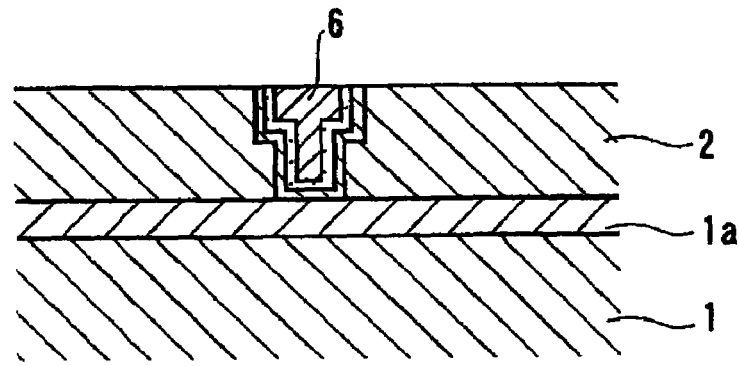

The high resistance structure 110, which has high resistance, is disposed in the plating solution chamber 100. Hence, influence of resistance of seed layer 7 (see FIG. 38A) becomes a negligible degree. Consequently, difference in current density over the surface of the substrate due to electrical resistance on the surface of the substrate W becomes small, and uniformity of a plated film over the surface of the substrate improves.

An anode (second electrode) 98, which has a number of vertical through holes 98a defined therein, is disposed in the plating solution chamber 100 above the high resistance structure 110. The anode (second electrode) 98 becomes a cathode during electrolytic etching. The electrode holder 94 has a plating solution discharge port 103 for discharging, under suction, plating solution from the plating solution chamber 100. The plating solution discharge port 103 is connected to a plating solution discharge pipe 106 extending from the plating solution supply equipment 18 (see FIG. 1). A plating solution (electrolytic solution) introducing portion (liquid introducing portion) 104 is provided in a peripheral wall of the electrode holder 94 at a position laterally of the anode 98 and the high resistance structure 110. In this embodiment, the plating solution introducing portion 104 comprises a tube having a lower end shaped as a nozzle, and is connected to a plating solution supply pipe 102 extending from the plating solution supply equipment 18 (see FIG. 1).

When the substrate holder 36 is in plating position B (see FIG. 3), the electrode head 28 is lowered until a gap between the substrate W held by the substrate holder 36 and the high resistance structure 110 becomes about 0.5 to 3 mm, for example, and then the plating solution introducing portion 104 pours plating solution into a region between the substrate W and the high resistance structure 110 from laterally of the anode 98 and the high resistance structure 110. The nozzle at the lower end of the plating solution introducing portion 104 is open toward a region between the sealing member 90 and the high resistance structure 110. A shield ring 112 of rubber is mounted on an outer circumferential surface of the high resistance structure 110 for electrically shielding the high resistance structure 110.

If the electroplating apparatus 12 is used as a substrate processing apparatus for performing a wet-type process, an immersion-type exposure process, or the like, then the plating solution introducing portion 104 serves as a liquid introducing portion for introducing a liquid such as pure water, a chemical solution, or the like between the substrate W and high resistance structure 110.

When the plating solution is introduced, the plating solution (liquid) introduced from the plating solution introducing portion 104 flows in one direction along the surface of the substrate W, as shown in FIG. 12. Flow of the plating solution pushes and discharges air out of a region between the substrate W and the high resistance structure 110, thereby filling the region with fresh plating solution whose composition has been adjusted that is introduced from the plating solution introducing portion 104. The plating solution is now retained in the region defined between the substrate W and the sealing member 90.

Since the plating solution is introduced into the region between the substrate W and the high resistance structure 110 from laterally of the anode 98 and the high resistance structure 110, the plating solution is introduced over the substrate W without provision of any parts responsible for disturbing an electric field distribution, such as an electrolytic solution supply tube made of an insulating material, within the high resistance structure 110. Even if the substrate has a large area, the electric field distribution over an entire surface of the substrate is made more uniform, and when the plating solution is introduced, the plating solution retained within the high resistance structure 110 is prevented from leaking from the high resistance structure 110. Therefore, the fresh plating solution whose composition has been adjusted is supplied into the region across which the substrate W held by the substrate holder 36 and the high resistance structure 110 face each other.

In the electroplating apparatus 12, when the plating solution is introduced, a reaction which tends to prevent a plated film from being embedded or partially change properties of a plated film may occur. To prevent such a reaction, it is desirable to pour the plating solution at a linear speed in a range from 0.1 to 10 m/sec. to complete introduction of the plating solution over a wafer having a diameter of 300 mm, for example, within 5 seconds. The plating solution introducing portion 104 should preferably be shaped to meet such a demand.

In order to suppress slime formation, the anode 98 is made of copper (phosphorus-containing copper) containing 0.03 to 0.05% of phosphorus. It is also possible to use an insoluble material for the anode.

In this embodiment, the cathodes (first electrodes) 88 are electrically connected to a cathode of a plating power source 114, and the anode (second electrode) 98 is electrically connected to an anode of the plating power source 114. If the electroplating apparatus 12 is used as an electrolytic etching apparatus, then the first electrodes 88 are connected to an anode of a power source, and the second electrode 98 is connected to a cathode of the power source. If the electroplating apparatus 12 is used as a substrate processing apparatus for performing a wet-type process such as an etching process, a cleaning process, or the like, or an immersion-type exposure process, then the first electrodes 88 and the second electrode 98 are dispensed with.

When performing electroplating, the first electrodes 88 are made cathodes and the second electrode 98 is made an anode via the plating power source 114, as described above, and the substrate holder 36 is positioned at plating position B (see FIG. 3). The electrode head 28 is lowered until a distance between the substrate W held by the substrate holder 36 and the high resistance structure 110 becomes e.g. about 0.1 to 3 mm. A plating solution is supplied from the plating solution introducing portion 104 to the region between the substrate W held by the substrate holder 36 and the high resistance structure 110, thereby filling the region 100 with the plating solution to perform plating.

In this state, an electrolytic etching solution may be used instead of the plating solution, and the first electrodes 88 may be made as anodes and the second electrode 98 as the cathode by the power source, for thereby performing electrolytic etching.

Next, an operation of a substrate processing system incorporating the electroplating apparatus 12 of this embodiment will be described.

First, a substrate W to be processed is taken out from one of the loading/unloading units 10 by the transfer robot 14, and transferred, with the surface to be processed facing upward, through the substrate carry-in and carry-out opening defined in the side panel, into one of the electroplating apparatuses 12. At this time, the substrate holder 36 is in lower substrate transfer position A. After a hand of the transfer robot 14 has reached a position directly above the substrate stage 68, the hand of the transfer robot 14 is lowered to place the substrate W on the support arms 70. The hand of the transfer robot 14 is then retracted through the substrate carry-in and carry-out opening.

After the hand of the transfer robot 14 is retracted, the splash prevention cup 40 is elevated. Then, the substrate holder 36 is lifted from substrate transfer position A to pretreatment/cleaning position C. As the substrate holder 36 ascends, the substrate W placed on the support arms 70 is positioned by the positioning plate 72 and the pressing finger 74 and then reliably gripped by the fixing fingers 76.

On the other hand, the electrode head 28 of the electrode arm portion 30 is in a normal position over the plating solution tray 22 now, and the high resistance structure 110 or the anode (second electrode) 98 is positioned in the plating solution tray 22. At the same time that the splash prevention cup 40 ascends, plating solution starts being supplied to the plating solution tray 22 and the electrode head 28. Until a step of plating the substrate W is initiated, new plating solution is supplied, and the plating solution discharge pipe 106 is evacuated to replace the plating solution in the high resistance structure 110 and remove air bubbles from the plating solution in the high resistance structure 110. When ascending movement of the splash prevention cup 40 is completed, the substrate carry-in and carry-out openings in the side panel are closed by the splash prevention cup 40, thereby isolating an atmosphere inside of the side panel and an atmosphere outside of the side panel from each other.

When the splash prevention cup 40 is elevated, a pre-coating step is initiated. Specifically, the substrate holder 36 that has received the substrate W is rotated, and the pre-coating/recovering arm 32 is moved from a retracted position to a position confronting the substrate W. When a rotational speed of the substrate holder 36 reaches a preset value, the pre-coating nozzle 64 mounted on the tip end of the pre-coating/recovering arm 32 intermittently discharges a pre-coating liquid which comprises a surface active agent, for example, toward a processing surface (plating surface) of the substrate W. At this time, since the substrate holder 36 is rotating, the pre-coating liquid spreads all over the processing surface of the substrate W. Then, the pre-coating/recovering arm 32 is returned to the retracted position, and the rotational speed of the substrate holder 36 is increased to spin the pre-coating liquid off and dry the processing surface of the substrate W.

After completion of the pre-coating step, a plating step is initiated. First, the substrate holder 36 is stopped against rotation, or the rotational speed thereof is reduced to a preset rotational speed for plating. In this state, the substrate holder 36 is lifted to plating position B. Then, the peripheral edge of the substrate W is brought into contact with the cathodes (first electrodes) 88, when it is possible to pass an electric current, and at the same time, the sealing member 90 is pressed against the upper surface of the peripheral edge of the substrate W, thus sealing the peripheral edge of the substrate W in a watertight manner.

Based on a signal indicating that the pre-coating step for the loaded substrate W is completed, on the other hand, the electrode arm portion 30 is swung in a horizontal direction to displace the electrode head 28 from a position over the plating solution tray 22 to a position over the plating position. After the electrode head 28 reaches this position, the electrode head 28 is lowered toward the electrode portion 38. At this time, the high resistance structure 110 does not contact the processing surface (plating surface) of the substrate W, but is held closely to the processing surface of the substrate W at a distance ranging from 0.5 mm to 3 mm. When descent of the electrode head 28 is completed, the plating power source 114 is applied between the cathodes 88 and the anode 98, and plating solution is supplied from the plating solution introducing portion 104 to the region between the substrate W and the high resistance structure 110 to fill the region with the plating solution, thereby performing plating of the surface (plating surface) of the substrate.

When plating is completed, the electrode arm portion 30 is raised and then swung to return to the position above the plating solution tray 22 and to lower to an ordinary position. Then, the pre-coating/recovering arm 32 is moved from a retreat position to a position confronting the substrate W, and lowered to recover a remainder of the plating solution on the substrate W by the plating solution recovering nozzle 66. After recovery of the remainder of the plating solution is completed, the pre-coating/recovering arm 32 is returned to the retreat position, and pure water is supplied from fixed nozzle 34 for supplying pure water toward a central portion of the substrate W for rinsing a plated surface of the substrate. At the same time, the substrate holder 36 is rotated at an increased speed to replace the plating solution on the surface of the substrate W with pure water. Rinsing the substrate W in this manner prevents splashing plating solution from contaminating the cathodes 88 of the electrode portion 38 during descent of the substrate holder 36 from plating position B.

After completion of the rinsing, a washing with water step is initiated. That is, the substrate holder 36 is lowered from plating position B to pretreatment/cleaning position C. Then, while pure water is supplied from the fixed nozzle 34 for supplying pure water, the substrate holder 36 and the electrode portion 38 are rotated to perform washing with water. At this time, the sealing member 90 and the first electrodes 88 can also be cleaned, simultaneously with the substrate W, by pure water directly supplied to the electrode portion 38, or pure water scattered from the surface of the substrate W.

After washing with water is completed, a drying step is initiated. That is, supply of pure water from the fixed nozzle 34 is stopped, and the rotational speed of the substrate holder 36 and the electrode portion 38 is further increased to remove pure water on the surface of the substrate W by centrifugal force and to dry the surface of the substrate W. The sealing member 90 and the cathodes 88 are also dried at the same time. Upon completion of this drying, rotation of the substrate holder 36 and the electrode portion 38 is stopped, and the substrate holder 36 is lowered to substrate transfer position A. Thus, gripping of the substrate W by the fixing fingers 76 is released, and the substrate W is just placed on the upper surfaces of the support arms 70. At the same time, the splash prevention cup 40 is also lowered.

All the steps including the plating step, the pretreatment step accompanying the plating step, the cleaning step, and the drying step are now finished. The transfer robot 14 inserts its hand through the substrate carry-in and carry-out opening into a position beneath the substrate W, and raises the hand to receive processed substrate W from the substrate holder 36. Then, the transfer robot 14 returns the processed substrate W received from the substrate holder 36 to one of the loading/unloading units 10.

While the electroplating process has been described in this embodiment, when direction of the current is reversed, i.e., when the apparatus is used as it is and a polarity of the power source is reversed, an electrolytic etching process can be performed and uniformity of etching can be increased. With respect to a plating process for forming copper interconnects for LSI, it is known to perform an electrolytic etching process by applying a reverse electrolysis before and after a plating process. For example, it has been confirmed to perform uniform etching for increased embedding characteristics by using this apparatus, performing a plating process for 7.5 seconds with a current density of 20 mA/cm$^2$ to form a plated copper film of 50 nm, reversing polarity of the power source, performing an etching process for 20 seconds with a current density of 5 mA/cm$^2$ to etch a plated copper film of 33 nm, and thereafter performing a final plating process.

In the above example, the apparatus has the high resistance structure. However, the present invention is also applicable to an electroplating apparatus (electrolytic polishing apparatus) having no high resistance structure.

If this electroplating apparatus (electrolytic processing apparatus and substrate processing apparatus) 12 is used as a substrate processing apparatus for performing a wet-type process such as a wet-type etching process, a wet-type cleaning process, or the like, then a liquid such as pure water, a solution, or the like is used instead of the plating solution, the electrode holder 94 is used as a member holder for holding a member used in a given process, and the plating solution introducing portion 104 is used as a liquid introducing portion for supplying the space between the substrate W and the member with a cleaning solution such as pure water, a chemical solution, or the like if the process is a wet-type cleaning process, or with an etching solution if the process is a wet-type etching process. Alternatively, the member holder may not be used, but the member itself may directly be held by the free end or the like of the swing arm 26.

Then, as described above, the substrate holder 36 is lifted to substrate processing position (plating position) B, the sealing member 90 is pressed against the upper surface of the peripheral edge of the substrate W, thereby sealing the peripheral edge of the substrate W in a watertight manner. Furthermore, the member holder (electrode head) 94 is lowered toward the electrode portion 38, and the member is stopped at a position which is kept out of contact with the surface of the substrate W, but closely thereto at a distance ranging from 0.5 mm to 3 mm. In this state, a liquid such as pure water, a chemical solution, or the like is introduced from the liquid introducing portion (plating solution introducing portion) 104 into the region between the substrate W and the member, thereby filling the region with the liquid. The surface (to be processed) of the substrate W is now processed by rotating the substrate W, if necessary.

By thus introducing the liquid into the region across which the substrate W held by the substrate holder 36 and the member face each other, laterally of the member, even if the substrate W is held with its surface facing upwardly, the liquid such as pure water, a chemical solution, or the like is supplied and retained uniformly without bubbles mixed therein between the substrate W and the member, for processing the substrate in a wet-type process such as an etching process, a cleaning process, or the like, or an immersion-type exposure process.

FIGS. 13A and 13B show different modifications, respectively, of the electrode head. FIG. 13A shows an example in which the plating solution introducing portion (liquid introducing portion) 104 connected to the above-described plating solution supply pipe 102 (see FIG. 10), for introducing the plating solution into the region sandwiched between the substrate W in the plating position and the high resistance structure 110, has a lower portion bent inwardly in the shape of a rectangle for ejecting plating solution (liquid) diametrically inwardly of substrate W to cause the plating solution to impinge upon an outer circumferential surface of the high resistance structure 110. FIG. 13B shows an example in which the plating solution introducing portion (liquid introducing portion) 104 is disposed obliquely downwardly in an inward direction laterally of the high resistance structure 110, so that plating solution (liquid) ejected from the plating solution introducing portion 104 positively produces a unidirectional flow thereof.

Figure 14A:
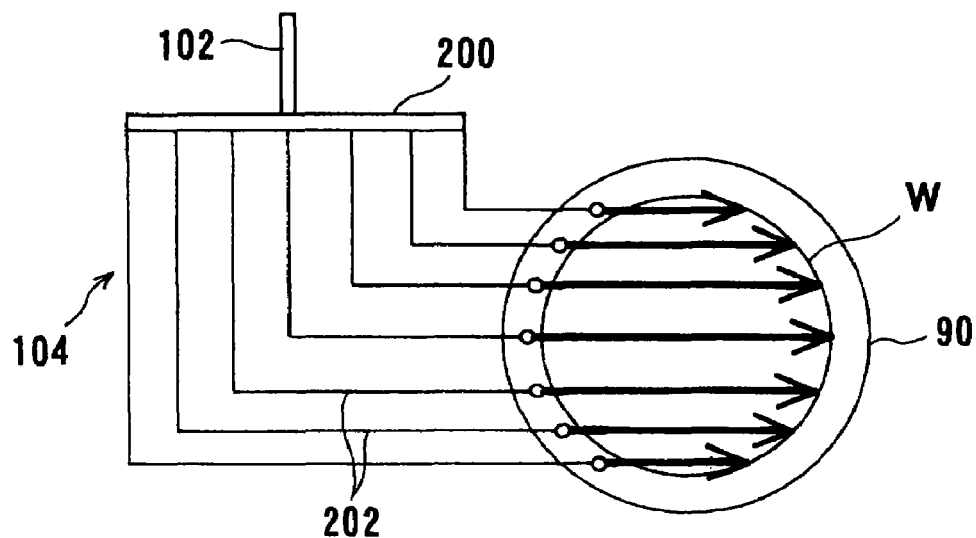
FIGS. 14A and 14B are views showing different examples, respectively, of the electrolytic solution introducing portion (liquid introducing portion)

In the above examples, the plating solution introducing portion (liquid introducing portion) 104 comprises a single tube. However, as shown in FIG. 14A, a plating solution introducing portion 104 may comprise a common pipe 200 connected to the above-described plating solution supply pipe 102, and a plurality of branch pipes 202 branched from the common pipe 200, with the branch pipes 202 being arranged in positions along a circumferential direction of the peripheral edge of the electrode holder 94 for allowing plating solution (liquid) ejected simultaneously from the branch pipes 202 to flow in one direction along the surface of the substrate W. By thus simultaneously supplying the plating solution from a plurality of locations and adjusting a number of those locations and positions thereof, as desired, the plating solution can be introduced at a linear speed ranging from 0.1 to 10 m/sec., so that introduction of the plating solution over a wafer having a diameter of 300 mm, for example, can be completed within 5 seconds. In this manner, it is possible to easily meet a demand for preventing a reaction from occurring when the plating solution is introduced over the substrate, preventing embedding of a plated film from failing, and preventing characteristics of the plated film from partially changing due to such a reaction, and also to allow air bubbles to be removed well.

Figure 14B:
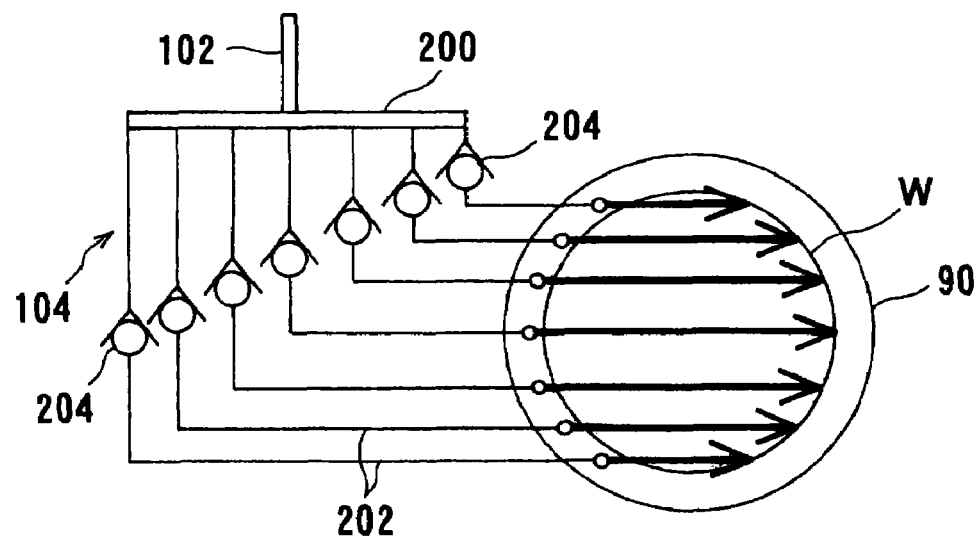

If air is entrapped in one of the branch pipes 202, for example, pressure in the pipes 200, 202 may be brought out of balance, thereby possibly causing plating solution (liquid) in the pipes 200, 202 to fall at one time. In order to prevent the solution from falling, as shown in FIG. 14B, check valves 204 should preferably be disposed in respective branch pipes 202 for keeping plating solution upstream of the check valves 204 at all times, thereby supplying the plating solution at a constant rate at all times.

Figure 15A:
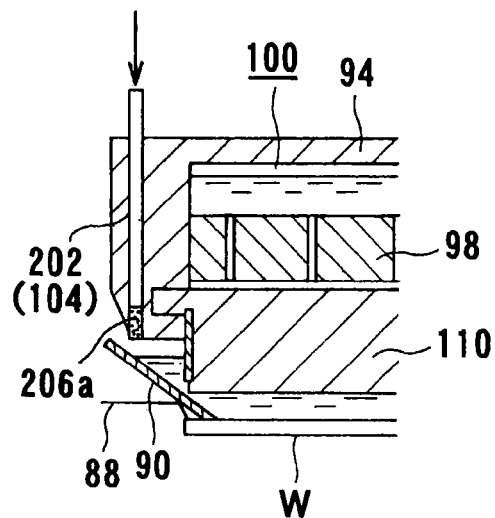
FIGS. 15A and 15B are views showing further different examples, respectively, of the electrolytic solution introducing portion (liquid introducing portion)
Figure 15B:
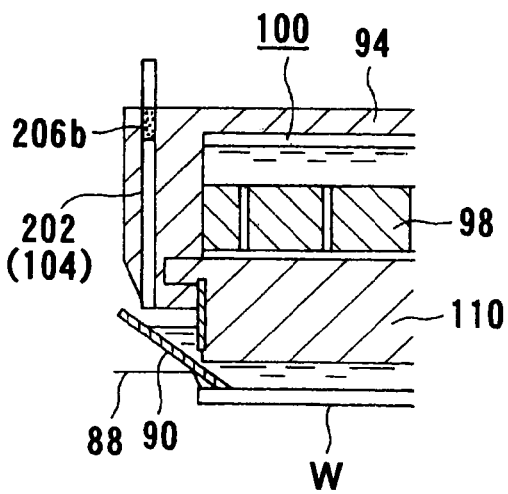

As shown in FIG. 15A, the check valves 204 may be replaced with porous members 206a filling lower ends of the respective branch pipes 202, or alternatively, as shown in FIG. 15B, the check valves 204 may be replaced with porous members 206b filling the respective branch pipes 202 somewhere in a longitudinal direction thereof, thus simplifying structure.

Figure 16A:
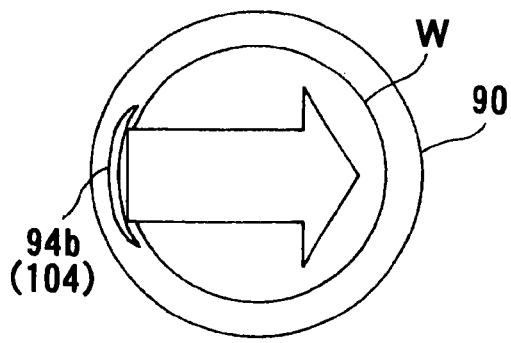
FIGS. 16A through 16C are views showing further different examples, respectively, of the electrolytic solution introducing portion (liquid introducing portion)
Figure 16B:
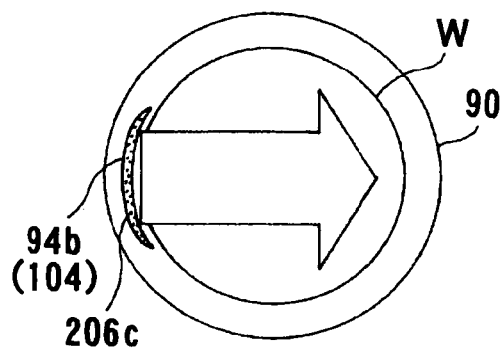
Figure 16C:
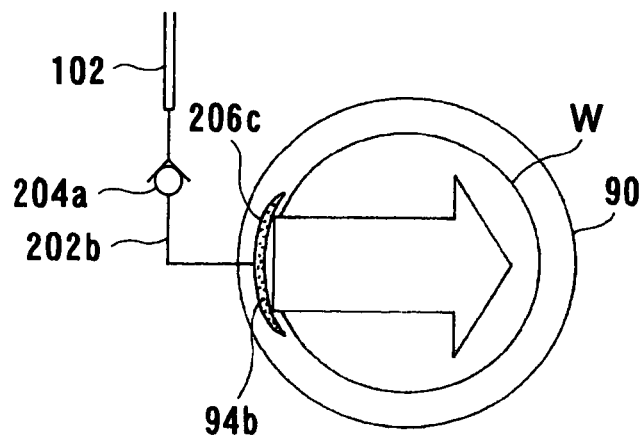

Alternatively, as shown in FIG. 16A, the electrode holder (member holder) 94 may have a circumferentially extending slit-like opening 94b defined in a lower surface thereof, with the opening 94b serving as the plating solution introducing portion (liquid introducing portion) 104. This arrangement is effective to increase a speed at which plating solution is introduced over a substrate. As shown in FIG. 16B, the opening 94b may be filled with a porous member 206c in the same manner as described above. Furthermore, as shown in FIG. 16C, a single tube 202b extending from the plating solution supply pipe 102 may be connected to the opening 94b filled with the porous member 206c, and a check valve 204a may be disposed in the tube 202b. This arrangement is effective in preventing plating solution from falling with a smaller number of check valves and making shorter a time required to introduce the plating solution over the substrate, than the arrangement shown in FIG. 14B, for example.

Figure 17A:
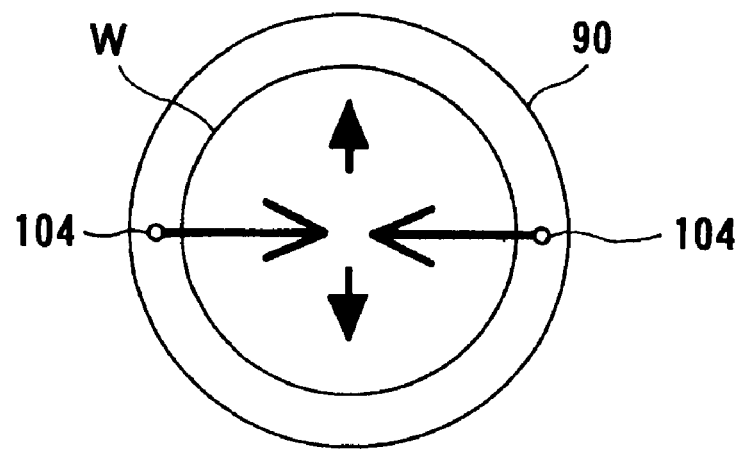
FIGS. 17A through 17C are views showing further different examples, respectively, of a positional relationship between the substrate, the sealing member, and the electrolytic solution introducing portion (liquid introducing portion) when in an electrolytic process.
Figure 17B:
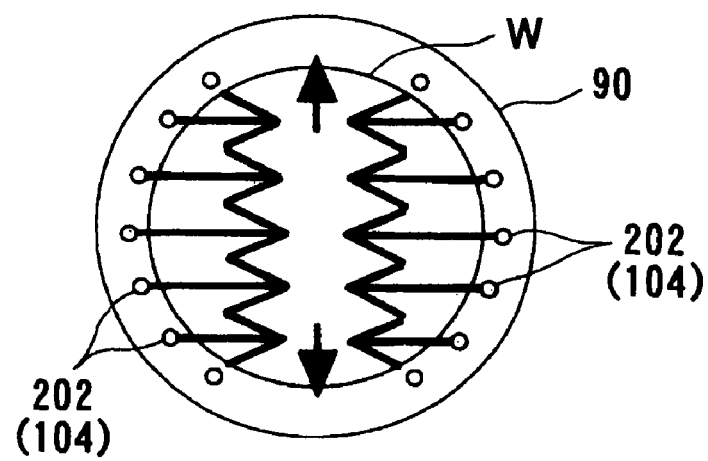
Figure 17C:
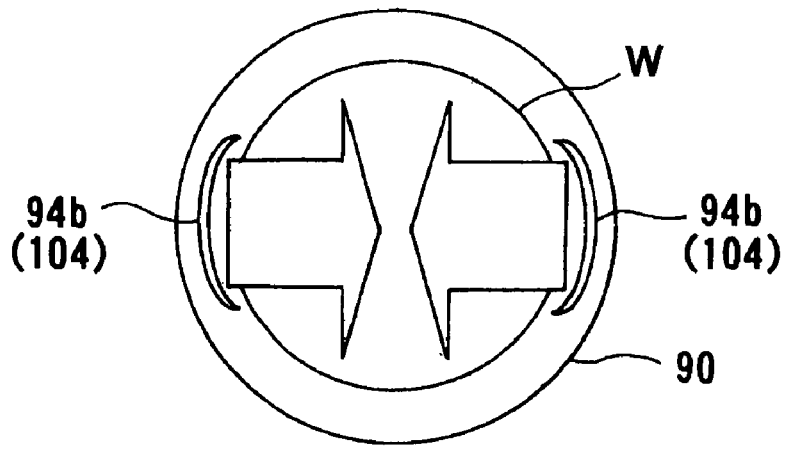

Moreover, as shown in FIG. 17A, a pair of plating solution introducing portions (liquid introducing portions) 104, each comprising a tube having the same structure as described above, may be disposed in respective positions which face each other across the substrate W on the electrode holder (member holder) 94, or as shown in FIG. 17B, a pair of plating solution introducing portions 104, each comprising a plurality of branch tubes 202 having the same structure as described above, may be disposed in respective positions which face each other across the substrate W on the electrode holder (member holder) 94. Further alternatively, as shown in FIG. 17C, a pair of plating solution introducing portions 104, each comprising a slit-like opening 94b having the same structure as described above, may be disposed in respective positions which face each other across the substrate W on the electrode holder 94.

With the above arrangements, plating solution (liquid) flows simultaneously inwardly from positions which face each other along the surface of the substrate W, thus further shortening time required to introduce the plating solution over the substrate. At this time, air in the region across which the substrate W and the high resistance structure 110 face each other is forced and discharged out in a direction perpendicular to flow of plating solution.

Figure 18A:
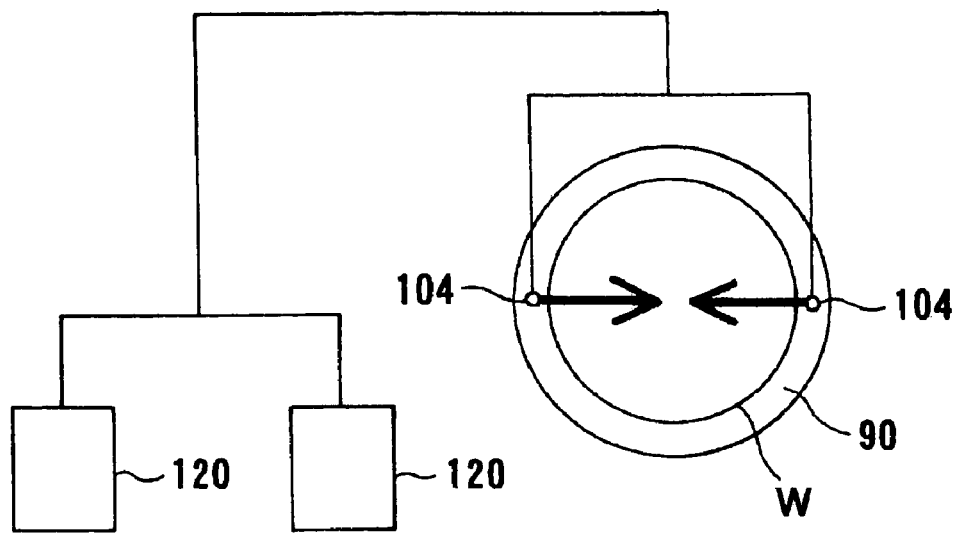
FIG. 18A is a view showing a further example of the electrolytic solution introducing portion (liquid introducing portion)
Figure 18B:
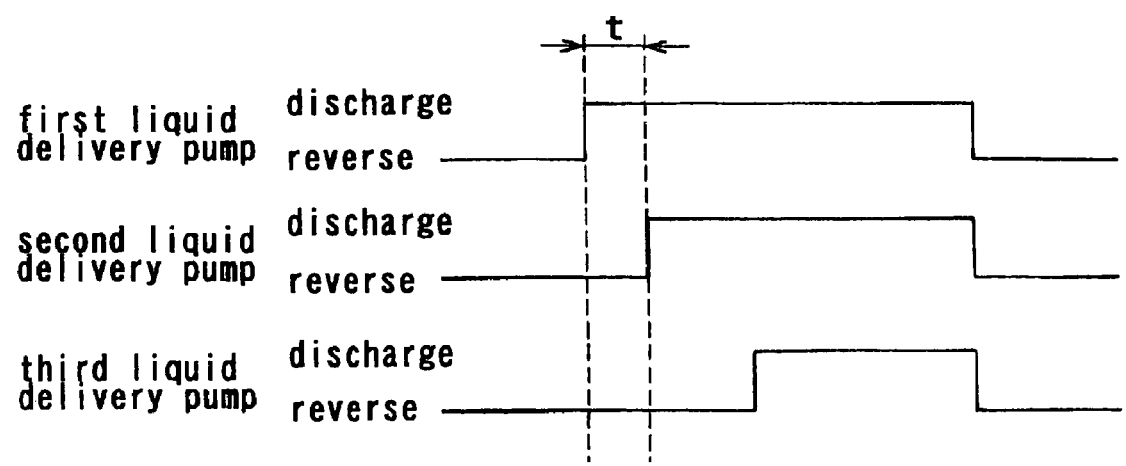
FIG. 18B is a view illustrative of a timing of discharging an electrolytic solution (liquid)

Furthermore, a plurality of liquid delivery pumps may be used to introduce the plating solution (liquid) at slightly different time intervals from the plating solution introducing portion (liquid introducing portion) 104 into the region across which the substrate W and the high resistance structure 110 face each other. For example, as shown in FIG. 18A, two plating solution introducing portions 104 are disposed in positions which face each other across the substrate W on the electrode holder (member holder) 94, and plating solution is delivered to the plating solution introducing portions 104 from a plurality of (two in FIG. 18A) liquid delivery pumps 120. As shown in FIG. 18B, a timing delay time t is set to at most 5 seconds, and after a first liquid delivery pump 120 is actuated, the second liquid delivery pump 120 is actuated with a timing delay of the delay time t. Such an operation may be repeated as many times as a number of liquid delivery pumps 120. By thus introducing a small amount of plating solution from the plating solution introducing portions 104, the plating solution is prevented from being introduced from outside, but can be introduced over the substrate with bubbles being prevented from being formed centrally on the substrate, and a shortage of the plating solution can be made up subsequently.

Figure 19A:
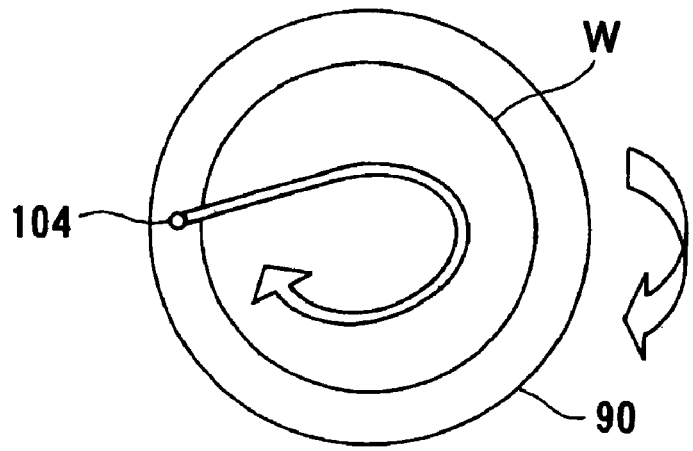
FIGS. 19A through 19C are views showing further different examples, respectively, of the electrolytic solution introducing portion (liquid introducing portion)
Figure 19B:
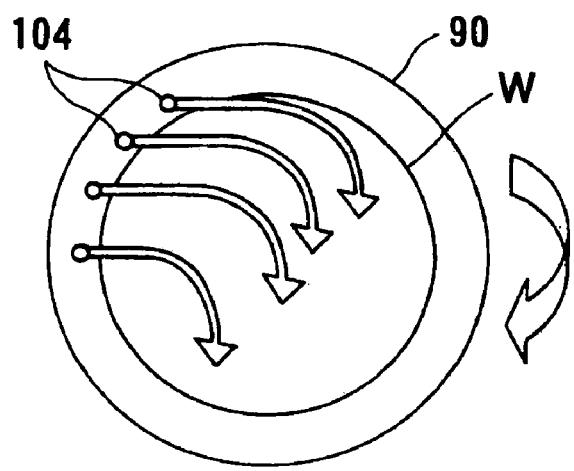
Figure 19C:
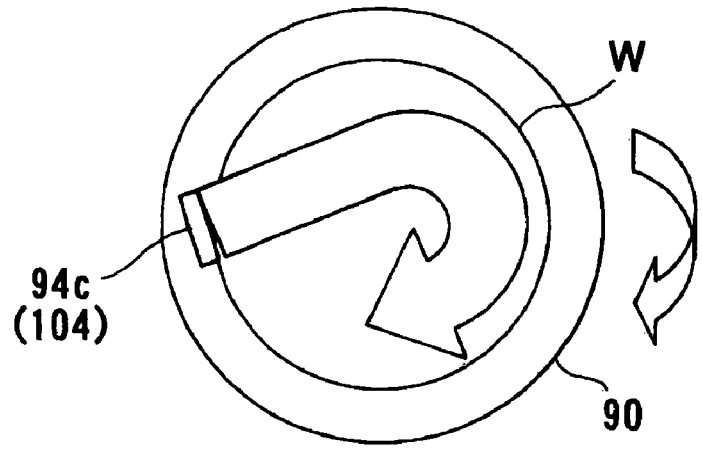

Rotation of the substrate W held by the substrate holder 36 and supply of the plating solution may be combined with each other to prevent air bubbles from remaining between the substrate W and the high resistance structure 110. Specifically, as shown in FIG. 19A, plating solution may be ejected from the plating solution introducing portion 104 in a direction slightly off from a center of the substrate W, and the substrate W may be rotated along a direction of flow of plating solution, or as shown in FIG. 19B, a plurality of plating solution introducing portions 104 may be disposed in a left upper half region, plating solution may be ejected substantially parallel from the plating solution introducing portions 104, and the substrate W may be rotated along a direction of flows of plating solution. Alternatively, as shown in FIG. 19C, plating solution may be ejected from the plating solution introducing portion 104, which comprises a wide slit-like opening 94c in the electrode holder 94, in a direction slightly off from the center of the substrate W, and the substrate W may be rotated along a direction of flow of plating solution. With these arrangements, air that is forced out by introduction of the plating solution can be moved toward the outer circumference of the substrate W under centrifugal forces produced by the rotation of the substrate W, and hence can be removed well.

Figure 20A:
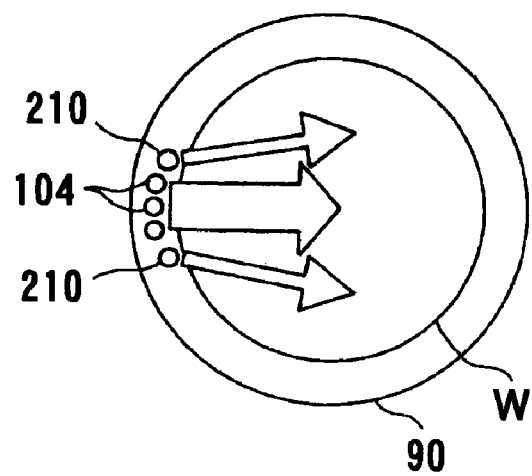
FIGS. 20A and 20B are views showing further different examples, respectively, of the electrolytic solution introducing portion (liquid introducing portion)
Figure 20B:
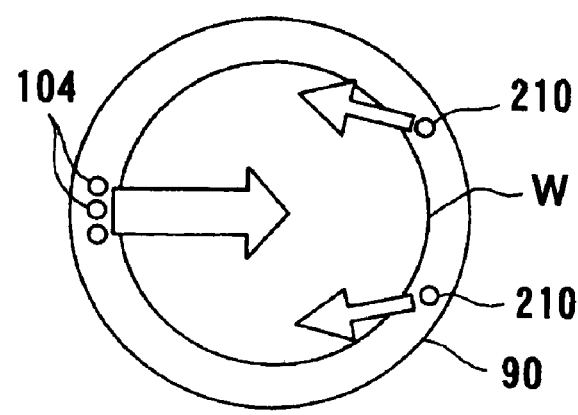

Furthermore, as shown in FIG. 20A, a plurality of (three in FIG. 20A) plating solution introducing portions (liquid introducing portions) 104 may be clustered, and an air ejector 210 is disposed on each side of the plating solution introducing portions 104 for ejecting air in slightly spreading directions on both sides of plating solution (liquid) ejected from the plating solution introducing portions 104. Alternatively, as shown in FIG. 20B, a pair of air ejectors 210 may be disposed in opposite relation to a plurality of (three in FIG. 20B) plating solution introducing portions (liquid introducing portions) 104 across the substrate W, for ejecting air in slightly spreading directions opposite to and toward plating solution ejected from the plating solution introducing portions 104. These arrangements are effective to prevent the plating solution from flowing around and also to prevent bubbles from being formed due to a mixture of plating solution flows, thus allowing air bubbles to be removed well.

Figure 21:
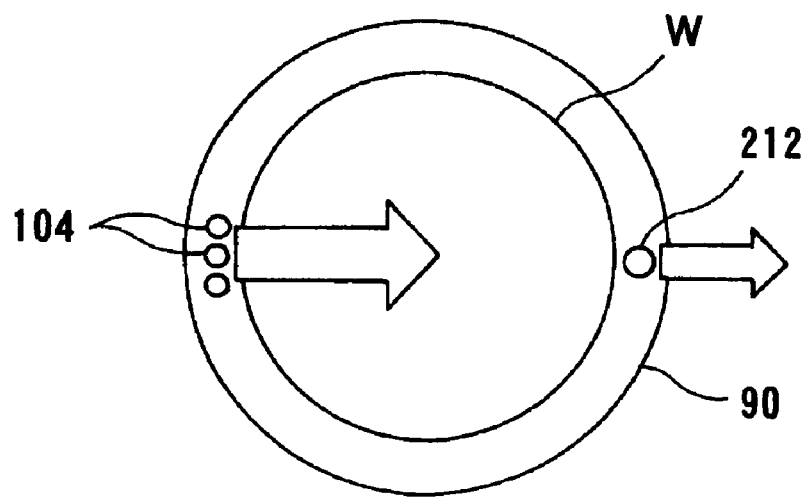
FIG. 21 is a view showing a further example of the electrolytic solution introducing portion (liquid introducing portion)

Moreover, as shown in FIG. 21, an air drawing portion 212 may be disposed in opposite relation to a plurality of (three in FIG. 20B) plating solution introducing portions (liquid introducing portions) 104 across the substrate W, for drawing air from the region between the substrate W and the high resistance structure 110 when plating solution is introduced from the plating solution introducing portions 104. This arrangement assists in spreading the plating solution to allow air bubbles to be removed well.

Furthermore, as shown in FIG. 22A, if a plurality of plating solution introducing portions (liquid introducing portions) 104b are disposed in a symmetric pattern on both sides of a centrally positioned plating solution introducing portion (liquid introducing portion) 104a, then plating solution may be discharged differently from the centrally positioned plating solution introducing portion 104a and the plating solution introducing portions 104b which are disposed outside of the centrally positioned plating solution introducing portion 104a, e.g., the plating solution may be ejected first from the centrally positioned plating solution introducing portion 104a, and then ejected from these outside plating solution introducing portions 104b, or one drop of plating solution may be dropped from the outside plating solution introducing portions 104b, and then the plating solution may be ejected from the centrally positioned plating solution introducing portion 104a, thereby allowing air bubbles to be removed well.

Such an arrangement can easily be realized by constructing, as shown in FIG. 22B, for example, plating solution introducing portion (liquid introducing portion) 104 of a common pipe 200 connected to plating solution supply pipe 102 and a plurality of branch pipes 202 branched from the common pipe 200, as described above, placing valves 214, which may be operated with air, in respective branch pipes 202, and giving the valves 214 a function to control timing to hold and discharge plating solution (liquid).

Figure 23A:
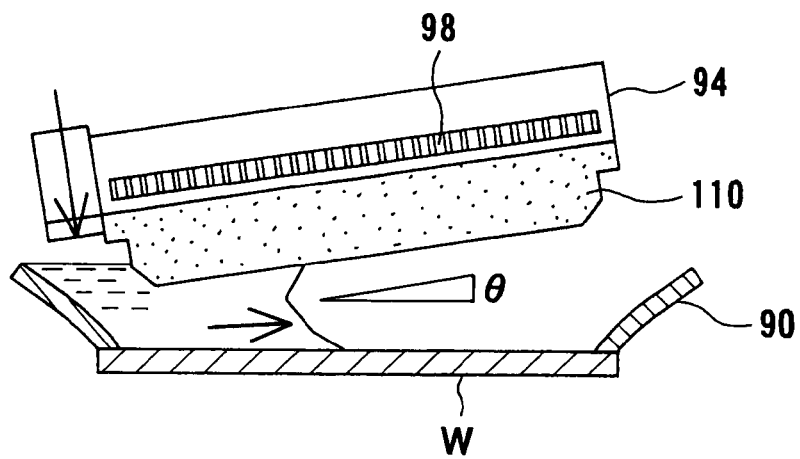
FIGS. 23A through 23C are views showing a process of introducing a plating solution (electrolytic solution) between a high resistance structure held by an electrode holder (member holder) and a substrate held by a substrate holder.
Figure 23B:
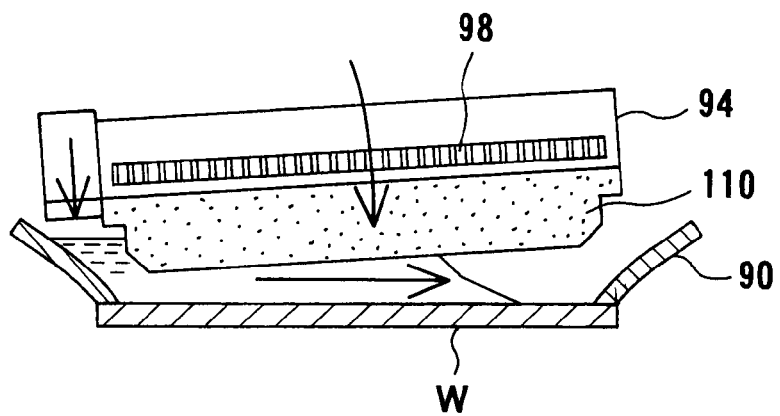
Figure 23C:
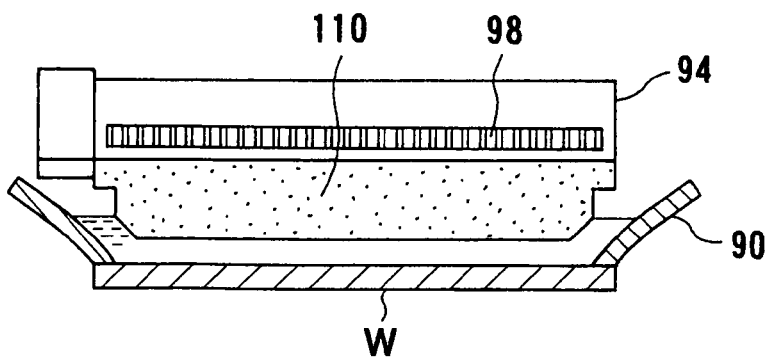
Figure 26:
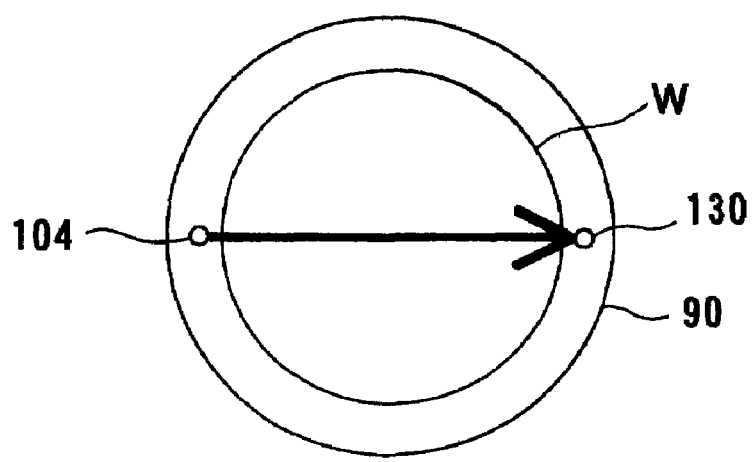
FIG. 26 is a view showing a positional relationship between a substrate, a sealing member, an electrolytic solution introducing portion (liquid introducing portion), and an electrolytic solution drawing portion (liquid drawing portion) of the electroplating apparatus shown in FIG. 25 when in a plating process.

Alternatively, as shown in FIGS. 23A through 23C, the electrode holder (member holder) 94 may be made tiltable and moved vertically, and while introducing plating solution (liquid) into the region, across which the substrate W and the high resistance structure 110 face each other, from one side where the substrate W held by the substrate holder 36 and the high resistance structure 110 are closest to each other when the electrode holder 94 is tilted, the high resistance structure 110 may be lowered back into its horizontal state. Further alternatively, the electrode holder (member holder) 94 may be kept horizontally, and while introducing the plating solution (liquid) into the region across which the substrate W and the high resistance structure 110 face each other from one side of the substrate W held by the substrate holder 36 and the high resistance structure 110, the high resistance structure 110 may be lowered.

Specifically, as shown in FIG. 23A, the electrode holder 94 is tilted to incline a lower surface of the high resistance structure 110 at an angle $\theta=0$ through 5°, preferably 0 through 1°, with respect to a horizontal plane, such that a distance between the lower surface of the high resistance structure 110 and the substrate W held by the substrate holder 36 is in a range from 0.1 to 10 mm, preferably from 1 to 3 mm. Then, plating solution (liquid) starts being introduced into the region across which the substrate W and the high resistance structure 110 face each other from one side where the substrate W and the high resistance structure 110 are closest to each other. Then, as shown in FIG. 23B, the electrode holder 94 is lowered to gradually reduce the distance between the lower surface of the high resistance structure 110 and the substrate W until the high resistance structure 110 and the substrate W lie parallel to each other. As shown in FIG. 23C, when the distance between the lower surface of the high resistance structure 110 and the substrate W reaches 0.1 to 10 mm, preferably 0.2 to 1 mm, and the high resistance structure 110 and the substrate W lie parallel to each other, the electrode holder 94 is stopped to complete introduction of the plating solution over the substrate.

At this time, an amount of plating solution is in a range from 10 cc to 1 L, preferably from 50 to 150 cc, for example, and the plating solution is discharged for a time ranging from 0.1 to 10 sec., preferably from 0.5 to 1.5 sec., for example. Time that is spent after the plating solution starts to be discharged until the substrate holder (member holder) 94 starts being lowered is in a range from 0.1 to 10 sec., preferably from 0.5 to 0.3 sec., for example.

As the high resistance structure 110 is lowered back to the horizontal position, or as the high resistance structure 110 is simply lowered, air that is present in the region across which the substrate W held by the substrate holder 36 and the high resistance structure 110 face each other is gradually forced out in one direction by the plating solution (liquid), and the plating solution (liquid) is supplied to the region. This arrangement is also effective in allowing air bubbles to be removed well.

FIG. 24 shows a cross section of an electrolytic processing apparatus (substrate processing apparatus), which is applied to an electroplating apparatus, according to another embodiment of the present invention. This embodiment is applied to an electroplating apparatus (electrolytic processing apparatus) of a so-called face-down type where substrate W is held with its surface facing downwardly. This electroplating apparatus has a substrate holder 308 for sealing in a watertight manner and holding a peripheral edge of the substrate W whose surface (to be plated) faces downwardly, with the substrate holder 308 having cathodes (first electrodes) 300 for contacting and supplying an electric current to the substrate W, and an upwardly open plating tank (water tank) 306 having a plating solution chamber (liquid chamber) 304 defined therein for holding plating solution (liquid) therein.

In the plating tank 306, there are disposed a high resistance structure 310 having the same construction as described above, and an anode (second electrode) 312 having a number of vertical through holes 312a defined therein, with the high resistance structure 310 and the anode 312 being immersed in plating solution held in the plating solution chamber 304. The plating tank 306 is connected to a plating solution supply pipe (liquid supply pipe) 314 for supplying the plating solution into the plating solution chamber 304, and a plating solution discharge pipe (liquid discharge pipe) 316 for discharging the plating solution from the plating solution chamber 304. A shield ring 324 of rubber is mounted on an upper inner circumferential surface of the high resistance structure 310 for electrically shielding the high resistance structure 310.

A plating solution introducing portion (liquid introducing portion) 318 is positioned laterally of the substrate holder 308 for introducing plating solution from laterally of the high resistance structure 310 into a region across which the substrate W held by the substrate holder 308 and the high resistance structure 310 face each other in a plating position. In this embodiment, the plating solution is supplied into the plating solution chamber 304, and retained therein such that its level coincides with an upper surface of the high resistance structure 310. Then, the substrate holder 308 is lowered, and the plating solution is introduced from the plating solution introducing portion 318 into a region between the substrate W held by the substrate holder 308 and the upper surface of the high resistance structure 310 (the level of the plating solution retained in the plating solution chamber 304). The region between the high resistance structure 310 and the substrate W is now filled with fresh plating solution whose composition has been adjusted, thereby plating a surface (lower surface) of the substrate W.

If this electroplating apparatus is used as a substrate processing apparatus for performing a wet-type process such as a wet-type etching process, a wet-type cleaning process, or the like, or an immersion-type exposure process, then a liquid such as pure water, a solution, or the like is used instead of the plating solution, and introduced into the liquid chamber (plating solution chamber) 304, and a member for use in this given process is used instead of the high resistance structure 310. Furthermore, the plating solution introducing portion 318 is used as a liquid introducing portion for introducing a liquid such as pure water, a chemical solution, or the like into a region between the substrate W and the member.

FIG. 25 shows an electrolytic processing apparatus (substrate processing apparatus), which is applied to an electroplating apparatus, according to still another embodiment of the present invention. This electroplating apparatus (electrolytic processing apparatus) comprises the electroplating apparatus according to the embodiment shown in FIGS. 1 through 12 (mainly FIG. 11) with the following structures added thereto.

The electrode holder (member holder) 94 has a plating solution drawing portion (liquid drawing portion) 130 positioned in facing relation across the substrate W for drawing plating solution introduced between the substrate W and the high resistance structure 110, with the plating solution drawing portion 130 being positioned laterally of the anode 98 and the high resistance structure 110. To the plating solution tank (liquid tank) 16 (see FIG. 1), there is connected an end of a plating solution supply line (liquid supply line) 136 having a discharge pump 132 and a filter 134 disposed therein. Another end of the plating solution supply line 136 is connected to the plating solution introducing portion (liquid introducing portion) 104. To the plating solution tank 16, there is also connected an end of a plating solution discharge line (liquid discharge line) 140 having a drawing pump 138 disposed therein. Another end of the plating solution discharge line 140 is connected to the plating solution drawing portion 130. With the above arrangement, there is constructed a plating solution circulating system (liquid circulating system) 142 which, when the pumps 132, 138 are actuated, supplies plating solution in the plating solution tank 16 to the region across which the substrate W and the high resistance structure 110 face each other, and returns the plating solution, supplied to the region across which the substrate W and the high resistance structure 110 face each other and kept in the region defined by the substrate W and the sealing member 90, to the plating solution tank 16.

If this electroplating apparatus is used as a substrate processing apparatus for performing a wet-type process such as a wet-type etching process, a wet-type cleaning process, or the like, or an immersion-type exposure process, then a liquid such as pure water, a solution, or the like is used instead of the plating solution, the electrode holder 94 is used as a member holder for holding a member for use in this given process, the plating solution drawing portion 130 is used as a liquid drawing portion, the plating solution supply line 136 is used as a liquid supply line, the plating solution introducing portion 104 is used as a liquid introducing portion, the plating solution discharge portion 140 is used as a liquid discharge portion, and the plating solution circulating system 142 is used as a liquid circulating system.

According to the above embodiment, as with the previously described embodiment, when the substrate holder 36 is in plating position (wet-type processing position) B (see FIG. 3), the electrode head 28 is lowered until a gap between the substrate W held by the substrate holder 36 and the high resistance structure 110 becomes about 0.5 to 3 mm, for example. Then, plating solution (liquid) is introduced from the plating solution introducing portion (liquid introducing portion) 104 into the region between the substrate W and the high resistance structure 110 to fill the region with the plating solution, and keeping the plating solution in a region defined by the substrate W and the sealing member 90. The plating solution is drawn from the plating solution drawing portion (liquid drawing portion) 130, i.e., as shown in FIG.

26, the region between the substrate W and the high resistance structure 110 is filled with the plating solution as it flows in one direction, while plating (substrate processing) a surface (lower surface) of the substrate W.

According to this embodiment, an electric field distribution over an entire surface of the substrate W is made more uniform without a need for any parts responsible for disturbing the electric field distribution, such as an electrolytic solution supply tube made of an insulating material, within the high resistance structure 110, and when the plating solution is introduced, the plating solution retained within the high resistance structure 110 is prevented from leaking from the high resistance structure 110. Furthermore, the plating solution (liquid) is introduced from laterally of the high resistance structure 110 into and circulated in the region between the substrate W held by the substrate holder 36 and the high resistance structure 110, so that the plating solution (liquid) can flow between the substrate W and the high resistance structure 110 at all times. Therefore, when an electroplating process is performed, a plating defect such as a plated film deposition failure due to a plating solution flow stoppage is prevented from occurring. By rotating the substrate if necessary, the plating solution (liquid) can flow at a more constant speed in central and peripheral regions of the substrate W.

According to this embodiment, the apparatus has a deaerating device for removing a dissolved gas from the plating solution (liquid) that is used in circulation as described above. Specifically, the plating solution tank (liquid tank) 16 is associated with an auxiliary circulation passage 144 for circulating the plating solution in the plating solution tank 16 when a circulation pump 141 is actuated, and a deaerating device 146 is disposed in the auxiliary circulation passage 144. The plating solution (liquid) after it has been deaerated by the deaerating device 146 is circulated and used in a plating process (substrate processing process), thus preventing a dissolved gas in the plating solution from being mixed as air bubbles in the plating solution when the plating solution is introduced, and hence from remaining in the plating solution.

The above deaerating device may also be used on plating solution that is introduced between the substrate and the high resistance structure, and used in a plating process in each of the above embodiments.

Figure 27A:
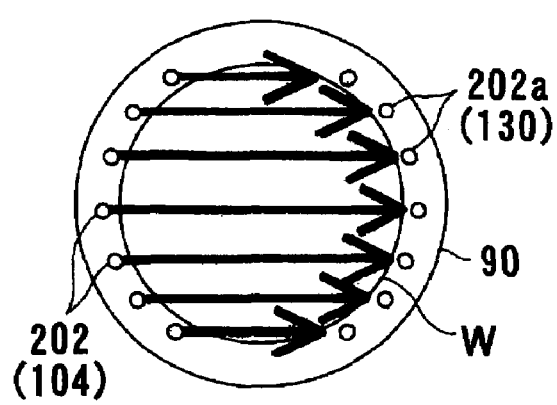
FIGS. 27A and 27B are views showing different examples, respectively, of the substrate, the sealing member, the electrolytic solution introducing portion (liquid introducing portion), and the electrolytic solution drawing portion (liquid drawing portion) when in the plating process.

As shown in FIG. 27A, in the same manner as described above, a plating solution introducing portion (liquid introducing portion) 104 may comprise a common pipe 200 connected to the plating solution supply pipe (liquid supply pipe) 102, and a plurality of branch pipes 202 branched from the common pipe 200 (see FIG. 14), and a plating solution drawing portion (liquid drawing portion) 130 may comprise a plurality of branch pipes 202a, identical to the branch pipes 202, and the branch pipes 202, 202a may be disposed in facing relation to each other across the substrate W, so that plating solution (liquid) ejected simultaneously from the branch pipes 202 flows in one direction along the surface of the substrate W and is drawn by the branch pipes 202a for circulation.

Figure 27B:
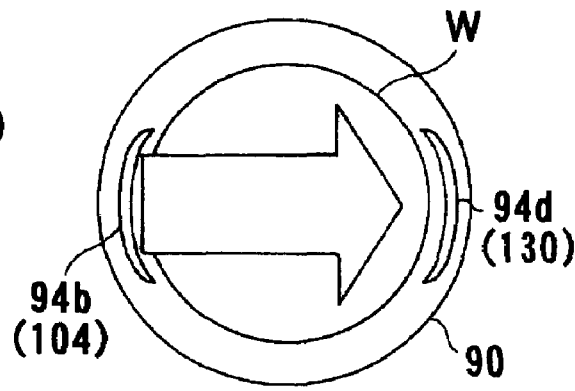

As shown in FIG. 27B, a plating solution introducing portion (liquid introducing portion) 104 comprising a circumferentially extending slit-like opening 94b may be defined in a lower surface of the electrode holder 94, and a plating solution drawing portion (liquid drawing portion) 130 comprising a slit-like opening 94d may be defined in the lower surface of the electrode holder 94 in facing relation to the plating solution introducing portion 104 across the substrate W on the electrode holder 94, so that plating solution (liquid) ejected from the slit-like opening 94b flows in one direction along the surface of the substrate W and is drawn by the slit-like opening 94d for circulation.

Figure 28:
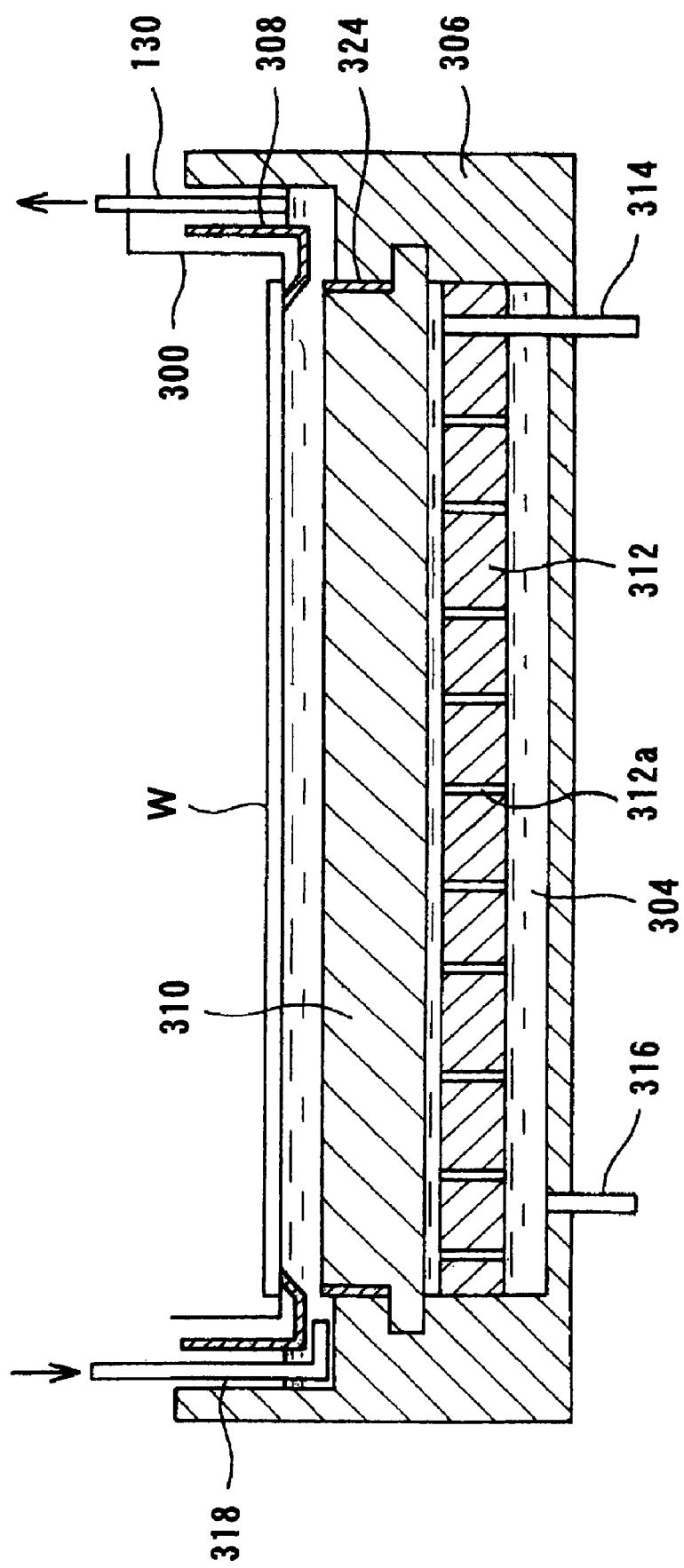
FIG. 28 is a view showing essential parts of an electroplating apparatus (electrolytic processing apparatus) according to yet another embodiment of the present invention.

FIG. 28 shows an electrolytic processing apparatus (substrate processing apparatus), which is applied to an electroplating apparatus, according to yet another embodiment of the present invention. This electroplating apparatus is of the so-called face-down type for holding the substrate W with its surface facing downwardly, as with the embodiment shown in FIG. 24, and is also of the circulation type for circulating the plating solution (liquid) flowing in one direction through the gap between the substrate W and the high resistance structure 110, as with the embodiment shown in FIG. 25. The electroplating apparatus according to this embodiment comprises the electroplating apparatus (electrolytic processing apparatus) shown in FIG. 24 and the plating solution drawing portion (liquid drawing portion) 130 of the electroplating apparatus (electrolytic processing apparatus) shown in FIG. 25. Other structural details are identical to those shown in FIG. 24.

Figure 29:
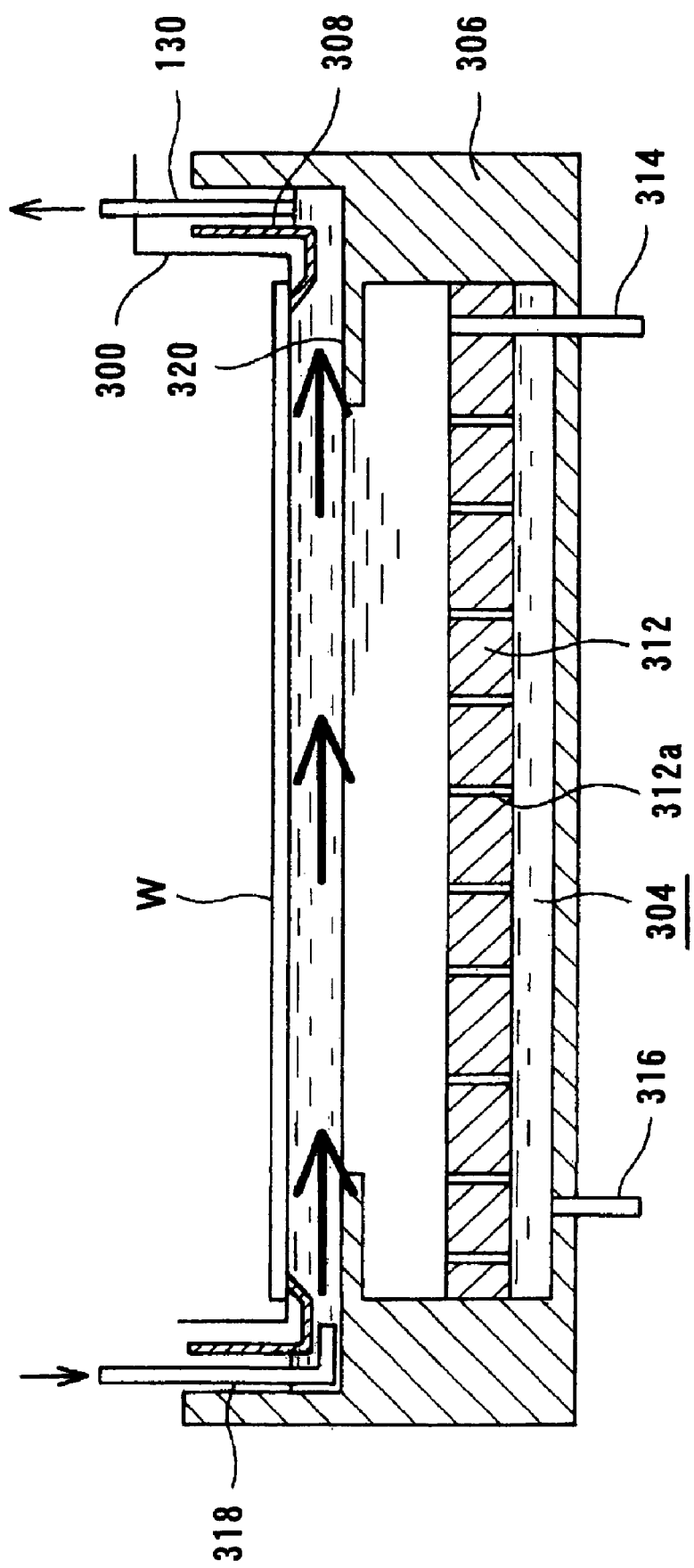
FIG. 29 is a view showing essential parts of an electroplating apparatus (electrolytic processing apparatus) according to yet another embodiment of the present invention.

FIG. 29 shows an electrolytic processing apparatus (substrate processing apparatus), which is applied to an electroplating apparatus, according to still yet another embodiment of the present invention. This embodiment differs from the embodiment shown in FIG. 28 in that it has no high resistance structure, but has a hollow disk-shaped shield plate 320 disposed above the plating solution chamber 304 in covering relation to a peripheral edge above the plating solution chamber 304. According to this embodiment, plating solution (liquid) is supplied into plating solution chamber 304, and retained therein such that its level coincides with a plane defined by an upper surface of the shield plate 320. Then, substrate holder 308 is lowered, and the plating solution is introduced from plating solution introducing portion (liquid introducing portion) 318 into a region between the substrate W held by the substrate holder 308 and the level of the plating solution. The plating solution (liquid) introduced into the region between the substrate W and the level of the plating solution (liquid) is drawn by plating solution drawing portion (liquid drawing portion) 130 for circulation, thus plating (processing) a surface (lower surface) of the substrate W.

Figure 30:
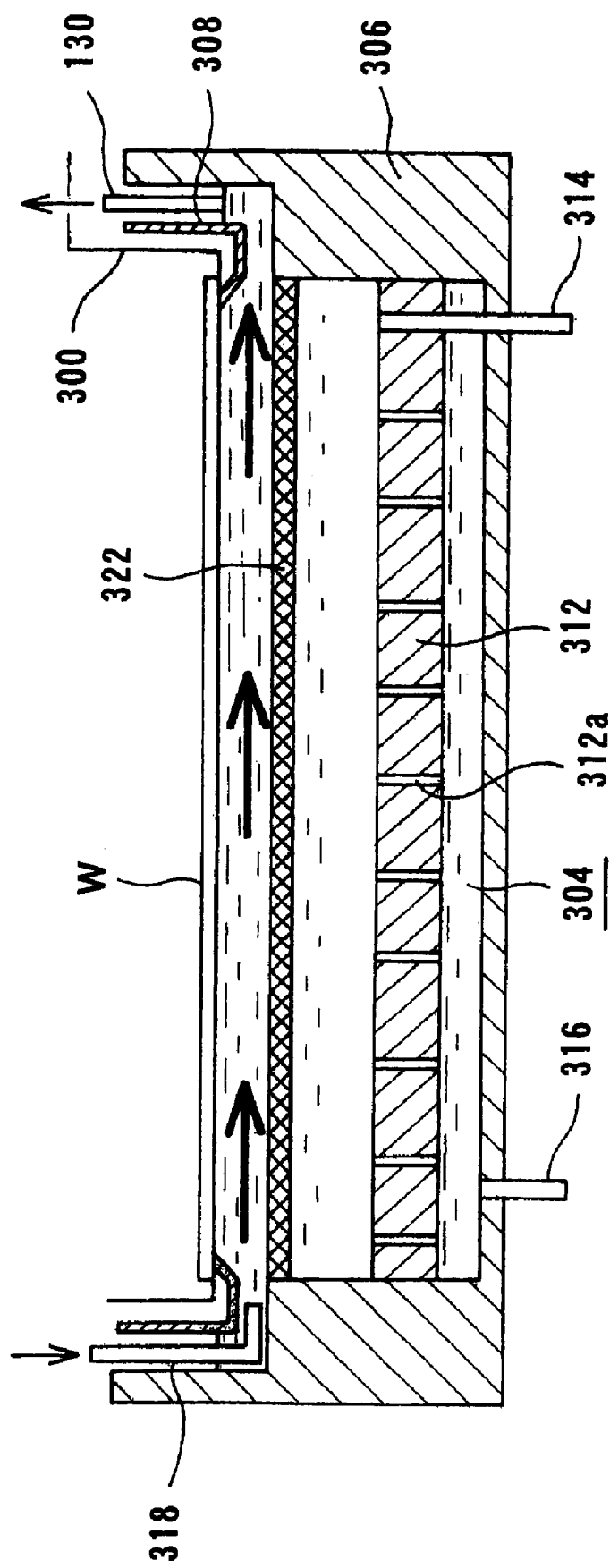
FIG. 30 is a view showing essential parts of an electroplating apparatus (electrolytic processing apparatus) according to yet another embodiment of the present invention.

FIG. 30 shows an electrolytic processing apparatus (substrate processing apparatus), which is applied to an electroplating apparatus, according to a further embodiment of the present invention. The present embodiment differs from the embodiment shown in FIG. 29 in that it has a disk-shaped mesh 322 disposed above the plating solution chamber 304 instead of the shield plate 320. Other structural details are identical to those shown in FIG. 29.

Figure 31:
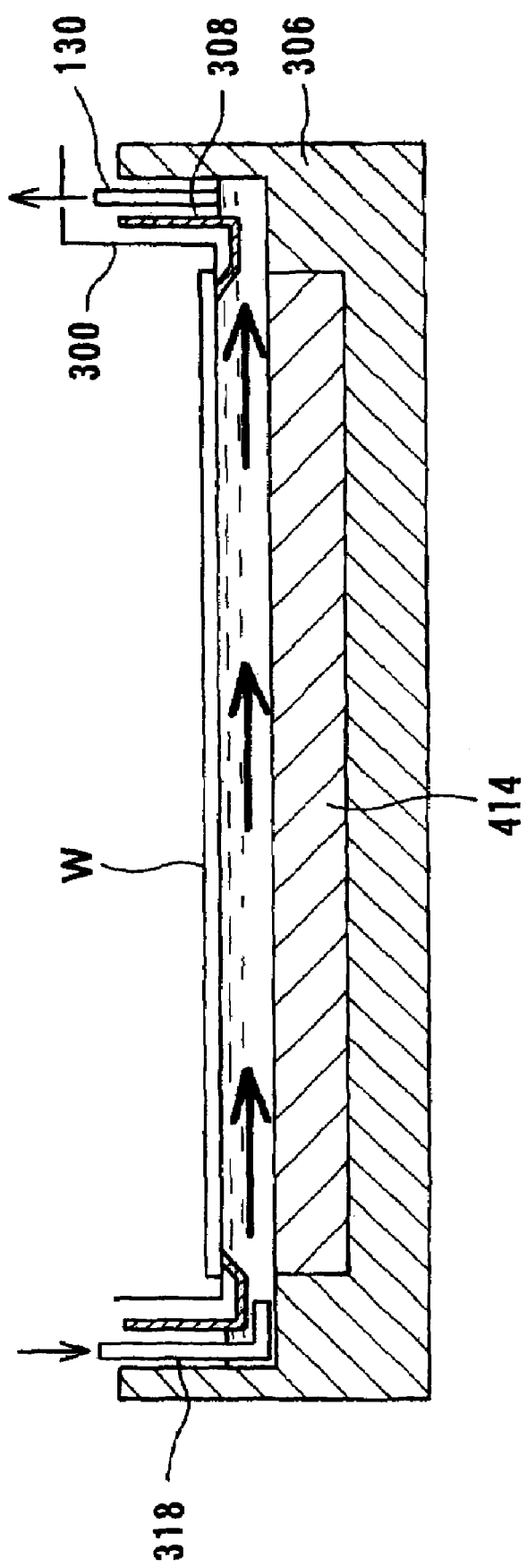
FIG. 31 is a view showing essential parts of an electroplating apparatus (electrolytic processing apparatus) according to yet another embodiment of the present invention.

FIG. 31 shows an electrolytic processing apparatus (substrate processing apparatus), which is applied to an electroplating apparatus, according to a still further embodiment of the present invention. This electroplating apparatus is of the so-called face-down type, and has a single solid anode 414 free of through holes therein which is disposed in plating tank 306, so that only plating solution (liquid) supplied between the anode 414 and substrate W is used to perform a plating process (substrate processing process). According to this embodiment, substrate holder 308, which is holding the substrate W, is lowered to a predetermined position. Plating solution (liquid) is introduced from plating solution introducing portion (liquid introducing portion) 318 into a region between the substrate W held by the substrate holder 308 and the anode 414, and the plating solution (liquid) introduced between the substrate W and the anode 414 is drawn by plating solution drawing portion (liquid drawing portion) 130 for circulation, thus plating (processing) a surface (lower surface) of the substrate W.

With the electrolytic processing apparatus according to the present invention, an electric field distribution over an entire surface to be processed of a substrate is made more uniform without a need for any parts responsible for disturbing the electric field distribution, such as an electrolytic solution supply tube made of an insulating material, within the high resistance structure even if the substrate has a large area in particular. When plating solution is introduced, plating solution retained within the high resistance structure is prevented from leaking from the high resistance structure. Therefore, fresh plating solution whose composition has been adjusted is supplied into a region across which the substrate held by the substrate holder and the high resistance structure face each other. If the electrolytic processing apparatus is applied to an electroplating apparatus, for example, then a more uniform electrolytic process can be performed to increase an in-plane uniformity of a film thickness of a plated film.

With the substrate processing apparatus according to the present invention, even if a substrate is held with its surface facing upwardly, a liquid such as pure water, a chemical solution, or the like can uniformly be supplied and retained between the substrate and a member without air bubbles mixed in a liquid for performing a substrate processing process such as a wet-type process e.g., an etching process or a cleaning process, or an immersion-type exposure process. Various substrate processing processes can successively be performed by holding and delivering the substrate with its surface facing upwardly, without a need for reversing the substrate through 180°.

Figure 32:
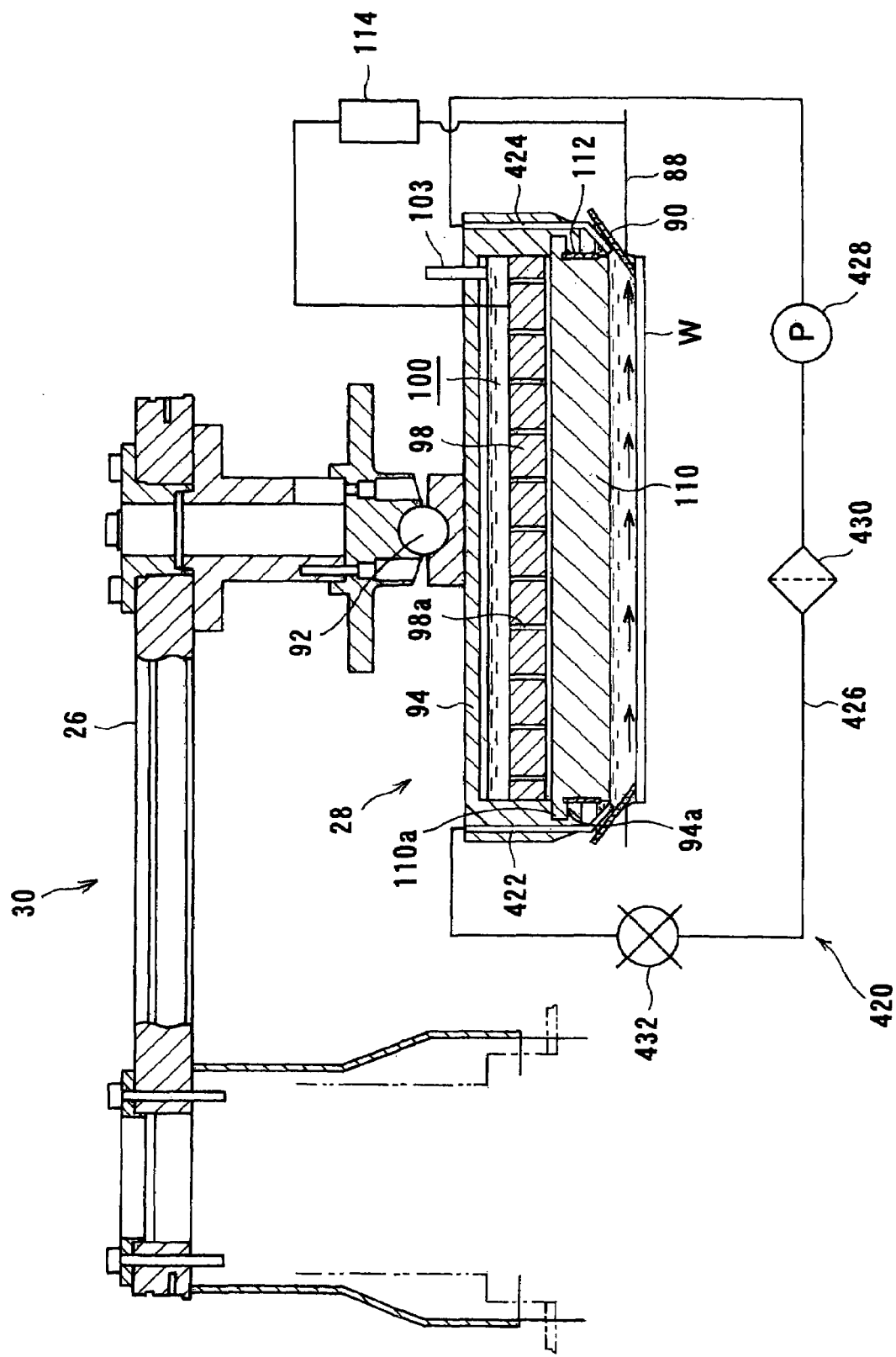
FIG. 32 is a cross-sectional view schematically showing an electrode head and a substrate holder of an electroplating apparatus according to an embodiment of the present invention when in a plating process.
Figure 33:
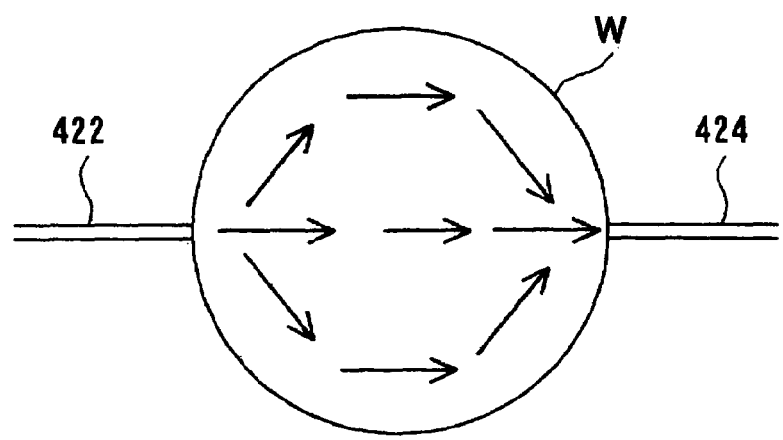
FIG. 33 is a view showing an example of a flow of plating solution along a surface of a substrate when in the plating process shown in FIG. 32.

FIGS. 32 and 33 show an electroplating apparatus according to an embodiment of the present invention. This electroplating apparatus has cathodes (first electrodes) 88 and an anode (second electrode) 98 which are identical in structure to those of the electroplating apparatus (electrolytic processing apparatus) shown in FIGS. 2 through 11. The cathodes 88 are electrically connected to a cathode of plating power source 114, and the anode 98 is electrically connected to an anode of the plating power source 114. The electroplating apparatus according to this embodiment differs from the electroplating apparatus (electrolytic processing apparatus) shown in FIGS. 2 through 11 as follows:

The electroplating apparatus has a plating solution flow forming section 420 for forming a uniform high-speed flow over an entire surface of substrate W along a gap between the substrate W held by substrate holder 36 and high resistance structure 110, which is formed by lowering electrode head 28 when the substrate holder 36 is in plating position B (see FIG. 3), as described below, by introducing plating solution into and discharging the plating solution from the gap.

The plating solution flow forming section 420 has a plating solution introducing portion 422 and a plating solution drawing portion 424 which are positioned laterally of the anode 98 and the high resistance structure 110 in a peripheral wall of electrode holder 94, and which are defined vertically through diametrically opposite positions across the anode 98 and the high resistance structure 110. The plating solution introducing portion 422 and the plating solution drawing portion 424 are connected to each other by a plating solution circulation line, 426 having a liquid delivery pump 428, a filter 430, and a flow rate regulation valve (flow rate changing valve) 432 as a flow rate controller. As shown in FIG. 33, the plating solution introducing portion 422 has a lower end shaped as a nozzle for ejecting the plating solution in multiple directions (e.g., three directions) to form a uniform plating solution flow. The plating solution drawing portion 424 is also shaped to smoothly converge the plating solution flow in the multiple directions.

When the substrate holder 36 is in plating position B (see FIG. 3), the electrode head 28 is lowered until the gap between the substrate W held by the substrate holder 36 and the high resistance structure 110 becomes at most 10 mm, preferably about 0.5 to 3 mm, for example, without the substrate W and the high resistance structure 110 being brought into contact with each other. The liquid delivery pump 428 is actuated to introduce plating solution from the plating solution introducing portion 422 into the region between the substrate W and the high resistance structure 110, and at the same time to discharge plating solution from the plating solution drawing portion 424. The region between the substrate W and the high resistance structure 110 is now filled with plating solution which has a uniform high-speed flow over an entire surface of the substrate W, thereby performing an embedding process with plating.

At this time, the flow ratio regulation valve 432 is operated to adjust a rate of a high-speed flow of plating solution between the substrate W and the high resistance structure 110 generally to a range from 0.5 to 10 m/sec., preferably to a range from 1 to 10 m/sec., or more preferably to a range from 8 to 10 m/sec. By thus adjusting the rate of the high-speed flow of plating solution, an electrolysis concentration at opening ends (inlets) of interconnect recesses is lessened by the high-speed flow of plating solution. By increasing a plating rate based on composition of the plating solution and plating conditions, the interconnect recesses can be embedded with copper or the like at a higher rate. At this time, the plating solution flow can force and discharge air out of the region between the substrate W and the high resistance structure 110.

In this embodiment, the cathodes 88 are to be electrically connected to a cathode of plating power source 114, and the anode 98 is to be electrically connected to an anode of plating power source 114. When the substrate holder 36 is in plating position B (see FIG. 3), the electrode head 28 is lowered until the gap between the substrate W held by the substrate holder 36 and the high resistance structure 110 becomes about 0.5 to 3 mm, for example. Then, the region between the substrate W and the high resistance structure 110 is filled with plating solution in the plating solution chamber 100, and the liquid delivery pump 128 is actuated to form a uniform high-speed flow of plating solution over an entire surface of the substrate W at a rate ranging form 0.5 to 10 m/sec., for example, between the substrate W and the high resistance structure 110. Simultaneously, the cathode of the plating power source 114 is connected to the cathodes 88, and the anode thereof is connected to the anode 98 for thereby performing a plating process.

Figure 34:
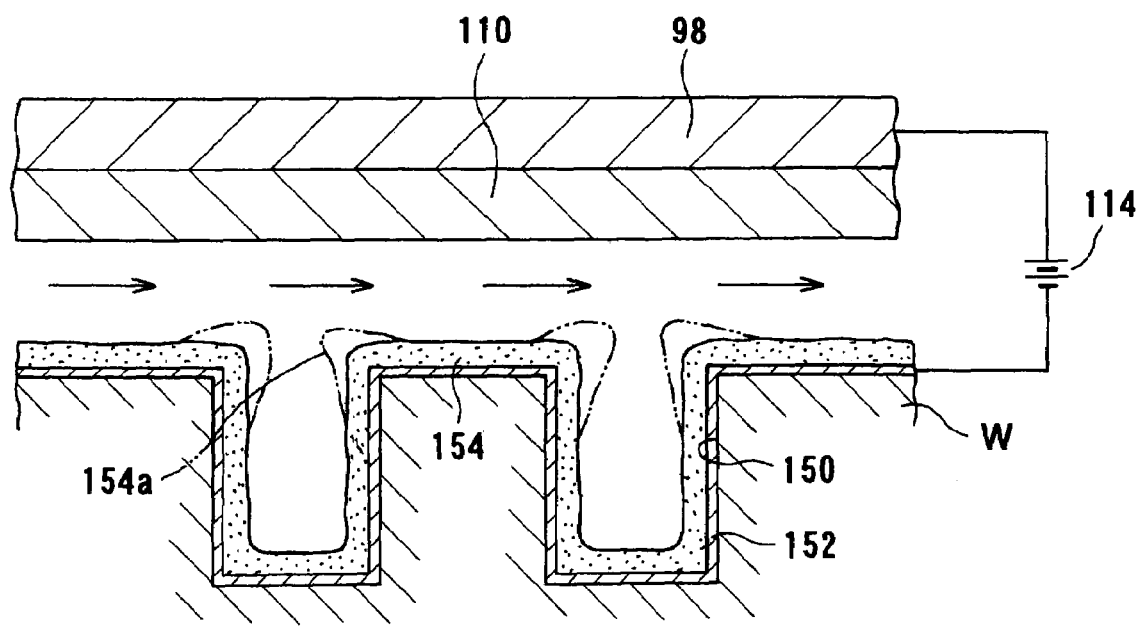
FIG. 34 is an enlarged schematic view showing an example of a film depositing state when in the plating process shown in FIG. 32.

A manner by which a high-speed flow of plating solution is formed and a plating process is performed is schematically shown in FIG. 34. FIG. 34 schematically shows a manner by which interconnect recesses 150 comprising trenches or via holes, each having an opening width or opening diameter of at least 10 μm and an aspect ratio of at least 1, are formed in a surface of substrate W, and an electrically conductive layer (barrier layer) 152 is formed thereon, with a surface of substrate W formed thus far being copper-plated to deposit a plated copper film 154 on a surface of the electrically conductive layer 152, thus embedding copper in the interconnect recesses 150.

If no uniform high-speed flow of plating solution is present over an entire surface of the substrate W during plating, then, as indicated by the imaginary lines in FIG. 34, an electric field tends to concentrate on opening ends (inlets) of the interconnect recesses 150 to precipitate a plated copper film 154a preferentially thereto, and thereby closing the inlets of the interconnect recesses 150 before the interconnect recesses 150 are fully embedded with copper. Therefore, voids tend to be produced in the copper (plated film) embedded in the interconnect recesses 150. According to this embodiment, however, a uniform high-speed flow of plating solution is formed over the entire surface of the substrate W to lessen an electrolysis concentration on the opening ends (inlets) of the interconnect recesses 150, thereby preventing a plated copper film from being precipitated preferentially in the inlets of the interconnect recesses 150, as indicated by the solid lines in FIG. 34. By increasing a plating rate based on composition of the plating solution and plating conditions, copper or the like can be embedded in the interconnect recesses 150 in a void-free fashion at a higher rate.

A composition of the plating solution, which is used at this time, may be as follows:
$CuSO_4 \cdot 5H_2O$: 200 g/L
$H_2SO_4$: 0.4 mol/L
Cl: 60 ppm
High-molecular surfactant: several hundreds ppm
Sulfur-based saturated organic compound: several ppm
Other additives: several ppm The high-molecular surfactant may be polyethylene glycol (molecular weight of about 3000) or polypropylene glycol (molecular weight of about 1000), and the sulfur-based saturated organic compound may be SPS, MPS, or the like. The other additives may include N-based high-polymer polydialkyl aminoethyl quaternary acrylate salt, polydiallyl dimethyl ammonium chloride, polyethylene imine, polyvinyl quaternary pyridine salt, polyvinyl amidine, polydiallyl amine, polyamine sulfonic aid, and the like.

At this time, a plating rate can be increased by applying a voltage of a high current value between the electrically conductive layer 152 and the anode 98. The current value is generally in a range from 10 to 50 $mA/cm^2$, and should preferably be in a range from 20 to 50 $mA/cm^2$ and more preferably from 40 to 50 $mA/cm^2$.

In this embodiment, the high resistance structure 110 is lowered to a position which is not in contact with the surface of the substrate W, but close thereto by a distance ranging from about 0.5 mm to 3 mm, and the plating solution chamber 100 is pressurized to fill the region between the substrate W and the high resistance structure 110 with the plating solution in the plating solution chamber 100. Thereafter, the liquid delivery pump 128 is actuated to form a uniform high-speed flow of plating solution over the entire surface of the substrate W at a rate ranging form 0.5 to 10 m/sec., for example, between the substrate W and the high resistance structure 110. Simultaneously, the cathode of the plating power source 114 is connected to the cathodes 88, and the anode thereof is connected to the anode 98, and a current in the range from 10 to 50 $mA/cm^2$ is passed to perform a plating process.

Figure 35:
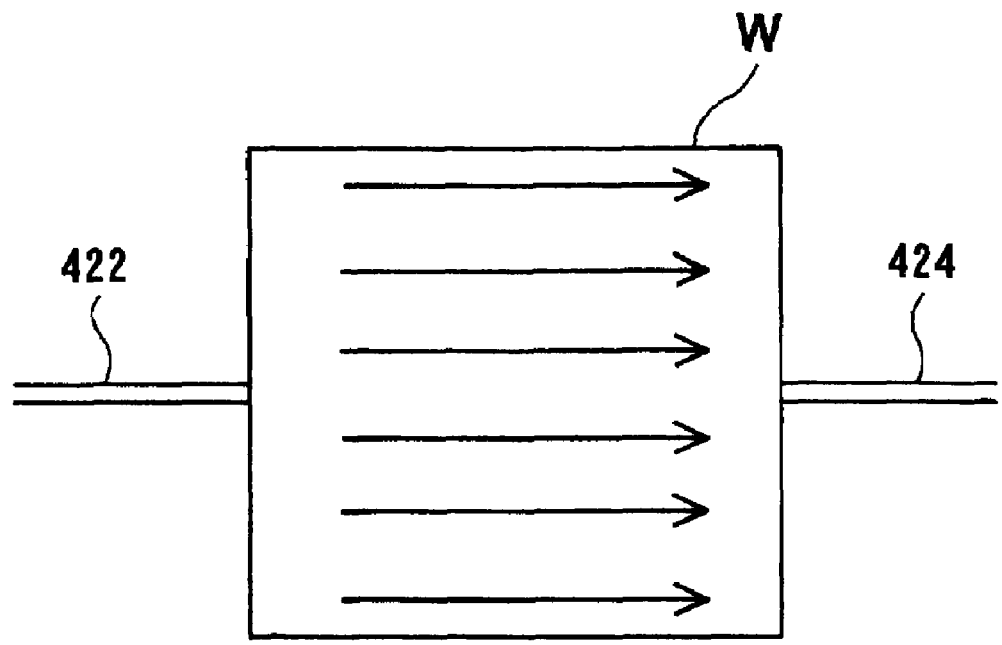
FIG. 35 is a view showing another example of a flow of plating solution along the surface of a substrate when in the plating process shown in FIG. 32.

If the substrate W is of a rectangular shape, as shown in FIG. 35, uniform high-speed flows of plating solution, which are parallel to each other, may be formed in one direction over an entire surface of the substrate W.

Figure 36:
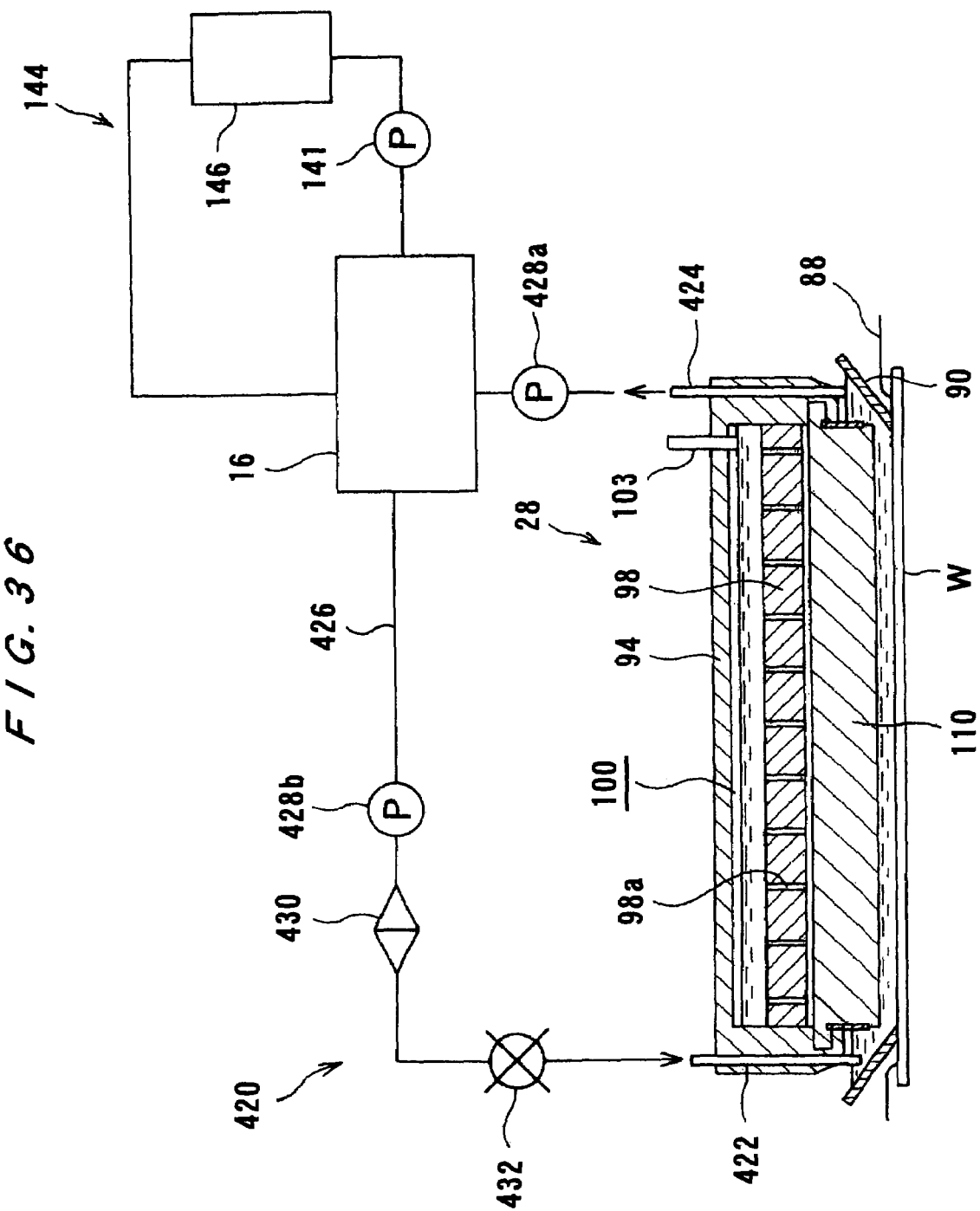
FIG. 36 is a view showing essential parts of an electroplating apparatus according to another embodiment of the present invention, together with a plating solution circulating system.

FIG. 36 shows an electroplating apparatus according to another embodiment of the present invention. This electroplating apparatus is different from the electroplating apparatus shown in FIGS. 32 and 33 in that the plating solution circulation line 426 has the plating solution tank 16 (see FIG. 1) and also has liquid delivery pumps 428a, 428b upstream and downstream of the plating solution tank 16. When the liquid delivery pumps 428a, 428b are actuated, plating solution in the plating solution tank 16 is supplied to a region across which substrate W and high resistance structure 110 face each other, flows as a uniform high-speed flow over an entire surface of the substrate W at a rate ranging from 0.5 to 10 m/sec. between the substrate W and the high resistance structure 110, and returns to the plating solution tank 16.

In this embodiment, the electroplating apparatus has a deaerating device for removing a dissolved gas from the plating solution that is used in circulation as described above. Specifically, the plating solution tank 16 is associated with an auxiliary circulation passage 144 for circulating the plating solution in the plating solution tank 16 when a circulation pump 141 is actuated, and a deaerating device 146 is disposed in the auxiliary circulation passage 144. The plating solution after it has been deaerated by the deaerating device 146 is circulated and used in a plating process, thus preventing a dissolved gas in the plating solution from being mixed as air bubbles in the plating solution when the plating solution is introduced, and hence from remaining in the plating solution.

Figure 37:
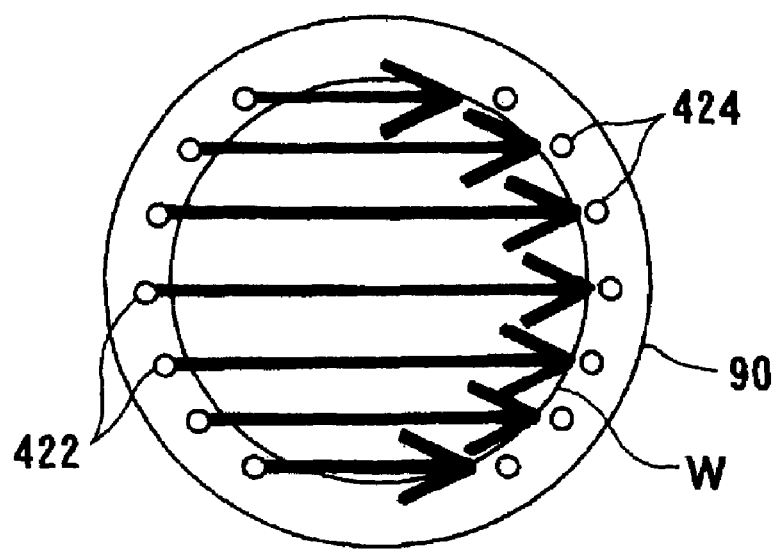
FIG. 37 is a view showing a positional relationship between a substrate, a sealing member, a plating solution introducing portion, and a plating solution drawing portion of the electroplating apparatus shown in FIG. 36 when in a plating process.

As shown in FIG. 37, a plurality of plating solution introducing portions 422 and a plurality of plating solution drawing portions 424 may be provided, and the plating solution introducing portions 422 and the plating solution drawing portions 424 may be disposed in positions facing each other across the substrate W, so that plating solution ejected simultaneously from the plating solution introducing portions 422 may flow as uniform high-speed parallel flows in one direction along the surface of the substrate W, and is then drawn from the plating solution drawing portions 424 for circulation.

In the embodiment shown in FIG. 24, a uniform high-speed flow of plating solution may be formed over the entire surface of the substrate W at a rate ranging from 0.5 to 10 m/sec. between the high resistance structure 310 and the substrate W. This also applies essentially to the embodiments shown in FIGS. 28 through 31.

The electroplating apparatus according to the present invention is capable of embedding copper in interconnect recesses (trenches or via holes) each having an opening width or opening diameter of several tens μm and an aspect ratio of at least 1 or at least 1.5, at a higher rate, e.g., a rate at least twice a conventional rate, without allowing voids to be formed in this embedded copper, for an increased production efficiency.

Example

A CSP substrate was prepared which has via holes (interconnect recesses) defined therein having an opening diameter of 40 μm and an aspect ratio of 1.5, and a copper seed layer formed as an electrically conductive layer on an entire surface thereof. Using the electroplating apparatus shown in FIGS. 32 and 33, a surface of the substrate was copper-plated using a plating solution of a composition described below under plating conditions described below, thus depositing a plated copper film on the surface of the electrically conductive layer to embed copper in via holes.
Plating Solution Composition
$CuSO_4 \cdot 5H_2O$: 200 (g/L)
$H_2SO_4$: 10 (g/L)
Cl: 60 ppm
PEG (molecular weight of about 3000): 200 ppm SPS: 5 ppm
polyethylene imine: 1 ppm
Plating Conditions
Plating solution speed: 1 m/s
Plating current: 15 mA/cm$^2$
Plating time: 3 hours As a result, it was confirmed that void-free copper was embedded in via holes.

As described above, the present method lends itself to a wide range of applications including formation of bumps, interconnects, and the like.

What is claimed is:

1. An electrolytic processing apparatus comprising:
   a substrate holder for holding a substrate such that a surface, to be processed, of the substrate faces upwardly;
   a first electrode for being brought into contact with the substrate so as to supply current to the surface of the substrate;
   a second electrode disposed above said substrate holder such that when the substrate is held by said substrate holder said second electrode is substantially parallel to the surface of the substrate;
   a resistance structure between said substrate holder and said second electrode such that when the substrate is held by said substrate holder said resistance structure is between the substrate and said second electrode;
   an electrolytic solution introducing portion for introducing an electrolytic solution, from laterally of said resistance structure, into a region across which the substrate and said resistance structure face each other when the substrate is held by said substrate holder, so as to allow the electrolytic solution to flow along the surface of the substrate;
   a power source for applying a voltage between said first electrode and said second electrode; and
   another electrolytic solution introducing portion for introducing the electrolytic solution, from laterally of said resistance structure, into the region across which the substrate and said resistance structure face each other when the substrate is held by said substrate holder,
   wherein said electrolytic solution introducing portion and said another electrolytic solution introducing portion are in positions facing one another other across the substrate when held by said substrate holder, and
   wherein said resistance structure is a high resistance structure by virtue of being constituted to have lower electric conductivity than that of the electrolytic solution by causing the electrolytic solution to enter into said resistance structure.

2. An electrolytic processing apparatus comprising:
   a substrate holder for holding a substrate such that a surface, to be processed, of the substrate faces upwardly;
   a first electrode for being brought into contact with the substrate so as to supply current to the surface of the substrate;
   a second electrode disposed above said substrate holder such that when the substrate is held by said substrate holder said second electrode is substantially parallel to the surface of the substrate;
   a resistance structure between said substrate holder and said second electrode such that when the substrate is held by said substrate holder said resistance structure is between the substrate and said second electrode;
   an electrolytic solution introducing portion for introducing an electrolytic solution, from laterally of said resistance structure, into a region across which the substrate and said resistance structure face each other when the substrate is held by said substrate holder, so as to allow the electrolytic solution to flow along the surface of the substrate;
   a power source for applying a voltage between said first electrode and said second electrode;
   another electrolytic solution introducing portion for introducing the electrolytic solution, from laterally of said resistance structure, into the region across which the substrate and said resistance structure face each other when the substrate is held by said substrate holder;
   a first liquid delivery pump, connected to said electrolytic solution introducing portion, for delivering the electrolytic solution from said electrolytic solution introducing portion at spaced time intervals; and
   a second liquid delivery pump, connected to said another electrolytic solution introducing portion, for delivering the electrolytic solution from said another electrolytic solution introducing portion at spaced time intervals,
   wherein said resistance structure is a high resistance structure by virtue of being constituted to have lower electric conductivity than that of the electrolytic solution by causing the electrolytic solution to enter into said resistance structure.

* * * * *